US009316666B2

(12) United States Patent
Suzuki

(10) Patent No.: US 9,316,666 B2
(45) Date of Patent: Apr. 19, 2016

(54) ACCELERATION SENSOR HAVING A CAPACITOR ARRAY LOCATED IN THE CENTER OF AN INERTIAL MASS

(71) Applicant: Murata Manufacturing Co., Ltd., Nagaokakyo-shi, Kyoto-Fu (JP)

(72) Inventor: Toshihisa Suzuki, Hamamatsu (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 269 days.

(21) Appl. No.: 14/090,266

(22) Filed: Nov. 26, 2013

(65) Prior Publication Data

US 2014/0144235 A1    May 29, 2014

(30) Foreign Application Priority Data

Nov. 27, 2012  (JP) ................................ 2012-258583
Nov. 27, 2012  (JP) ................................ 2012-258584
Nov. 27, 2012  (JP) ................................ 2012-258586

(51) Int. Cl.
  *G01P 15/125*    (2006.01)
  *G01P 15/18*     (2013.01)
  *B81B 3/00*      (2006.01)
  *G01P 15/08*     (2006.01)

(52) U.S. Cl.
  CPC .............. *G01P 15/125* (2013.01); *B81B 3/0051* (2013.01); *G01P 15/18* (2013.01); *B81B 2201/0235* (2013.01); *G01P 2015/0814* (2013.01); *G01P 2015/0871* (2013.01)

(58) Field of Classification Search
  CPC ... G01P 15/125; G01P 15/18; G01P 15/0802; G01P 15/02; G01P 15/08
  USPC ................. 73/514.32, 514.36, 514.38, 510
  See application file for complete search history.

(56) References Cited

U.S. PATENT DOCUMENTS

| 5,441,300 | A |   | 8/1995 | Yokota et al. | |
|-----------|---|---|--------|---------------|---|
| 5,487,305 | A |   | 1/1996 | Ristic et al. | |
| 6,065,341 | A | * | 5/2000 | Ishio | B81B 3/0051 361/283.3 |
| 6,272,926 | B1 | * | 8/2001 | Fehrenbach | B81B 3/0051 73/514.32 |
| 6,360,605 | B1 |   | 3/2002 | Pinter et al. | |
| 6,840,106 | B1 | * | 1/2005 | McNeil | G01P 15/18 73/514.32 |
| 7,111,513 | B2 | * | 9/2006 | Sugiura | G01C 19/5719 73/504.12 |
| 7,554,340 | B2 | * | 6/2009 | Furukubo | G01P 15/0802 324/661 |
| 8,516,891 | B2 | * | 8/2013 | Zhang | B81B 3/0051 73/514.32 |

(Continued)

FOREIGN PATENT DOCUMENTS

| CN | 1844935 A | 10/2006 |
|----|-----------|---------|
| CN | 101842709 A | 9/2010 |

(Continued)

*Primary Examiner* — Helen Kwok
(74) *Attorney, Agent, or Firm* — Arent Fox LLP

(57) ABSTRACT

An acceleration sensor achieving improvement of sensitivity and comprehensive miniaturization as a device includes a first sensor. The first sensor is furnished with an electrostatic capacitor that is configured such that a first fixed electrode, a second fixed electrode and a movable electrode are intensively arranged in a row. In the electrostatic capacitor, the first fixed electrode, the second fixed electrode and the movable electrode are arranged adjoining one another in acceleration detection direction (y-axis direction) at a position corresponding to the center of a weight in a plane view of a substrate. At one of longitudinal-side's ends of each electrode (one of ends in x-axis direction), connectors are provided so as to connect the first fixed electrode and the second fixed electrode to the substrate by connectors.

17 Claims, 19 Drawing Sheets

(56) References Cited

U.S. PATENT DOCUMENTS

| | | | |
|---|---|---|---|
| 8,736,254 B2* | 5/2014 | Kanemoto | G01P 15/0802 324/162 |
| 2001/0025530 A1* | 10/2001 | Sakai | B81B 3/0008 73/514.32 |
| 2004/0055382 A1 | 3/2004 | Samuels et al. | |
| 2004/0182157 A1* | 9/2004 | Sakai | G01P 15/125 73/514.32 |
| 2005/0026942 A1 | 2/2005 | Bridger et al. | |
| 2007/0180912 A1 | 8/2007 | Judy et al. | |
| 2008/0087085 A1* | 4/2008 | Ueda | G01P 15/0891 73/514.32 |
| 2008/0314147 A1* | 12/2008 | Nasiri | G01P 15/125 73/514.32 |
| 2009/0282914 A1* | 11/2009 | Rehle | G01P 15/125 73/504.12 |
| 2010/0107763 A1* | 5/2010 | Lin | G01P 15/125 73/514.32 |
| 2010/0206072 A1 | 8/2010 | Tebje et al. | |
| 2011/0154899 A1* | 6/2011 | Classen | G01P 15/125 73/514.32 |
| 2012/0000287 A1* | 1/2012 | Frangi | G01P 15/125 73/514.32 |
| 2012/0297879 A1* | 11/2012 | Ullrich | G01P 15/125 73/514.32 |

FOREIGN PATENT DOCUMENTS

| | | |
|---|---|---|
| CN | 102156202 A | 8/2011 |
| JP | 05-340960 A | 12/1993 |
| JP | 06-258340 A | 9/1994 |
| JP | H07-245413 A | 9/1995 |
| JP | 2773495 B2 | 7/1998 |
| JP | 11-344507 A | 12/1999 |
| JP | 3327595 B2 | 9/2002 |
| JP | 2005-534016 A | 11/2005 |

* cited by examiner

ACCELERATION SENSOR HAVING A CAPACITOR ARRAY LOCATED IN THE CENTER OF AN INERTIAL MASS

CROSS-REFERENCE TO RELATED APPLICATION

This application is based upon and claims the benefit of priority of the prior Japanese Patent Applications No. 2012-258583, No. 2012-258584, No. 2012-258586 each filed on Nov. 27, 2012, the entire contents of which are incorporated herein by reference.

FIELD

The present invention relates to an acceleration sensor achieved by implementing MEMS (micro electro mechanical system) technology.

BACKGROUND

Among acceleration sensors manufactured based on MEMS technology, there have been manufactured some acceleration sensors equipped with electrostatic capacitors of which electrostatic capacity is changeable according to acceleration. For instance, a typical electrostatic capacitor for an acceleration sensor consists of a fixed electrode fixed to a substrate and a movable electrode installed on a weight which is movable with respect to the substrate so that the acceleration sensor employing such an electrostatic capacitor can detect acceleration associated with a change of electrostatic capacity in the electrostatic capacitor (for instance, Japanese Laid-Open Patent Publication No. 11-344507). The acceleration sensor disclosed in Japanese Laid-Open Patent Publication No. 11-344507 is configured such that, regarding a weight (mass body) having a rectangular shape long in the x-axis, its x-axis directional both ends are connected to a substrate via supports fixed to the substrate and elastic members (for instance, springs) while electrostatic capacitors are arranged separately at y-axis directional both sides of the weight to move in the x-axis direction. Thereby, the acceleration sensor disclosed in the Publication is provided as a uniaxial acceleration sensor in which a change of electrostatic capacity caused when the weight moves in a detection direction (x-axis direction) is outputted in proportion to acceleration speed.

Further, each movable electrode of the above acceleration sensor is arranged extending in one direction (y-axis direction) from the weight so as to face a fixed electrode installed on the substrate. Thus, the acceleration sensor disclosed in the above Publication is provided as a uniaxial acceleration sensor in which a change of electrostatic capacity is outputted based on a change of distance between the fixed electrode and the movable electrode that is caused when the weight moves in the detection direction (x-axis direction).

Besides the above-mentioned uniaxial acceleration sensor for detecting acceleration working in a single direction, there have been some three-dimensional acceleration sensors capable of detecting three dimensional acceleration, i.e., in x, y and z axis directions (for instance, Japanese Laid-Open Patent Publication No. 07-245413, Published Japanese Translation of PCT International Patent Application No. 2005-534016, Japanese Laid-Open Patent Publication No. 06-258340, Japanese Laid-Open Patent Publication No. 05-340960, Japanese Patent No. 2773495, Japanese Patent No, 3327595, etc.). For instance, an acceleration sensor disclosed in Japanese Laid-Open Patent Publication No. 07-245413 is configured such that a weight is connected to four beams each fixed to a substrate so as to allow the weight to move three dimensionally, i.e., with respect to x-axis, y-axis and z-axis axis directions. Regarding the acceleration sensor disclosed in the Publication, with reference to the center of the weight (the center when the weight is seen from the top), electrostatic capacitors are separately arranged for detecting acceleration working in the x-axis direction and acceleration working in the y-axis direction, wherein the x-y plane is parallel with a plane direction of the weight. Further, movable electrodes of the electrostatic capacitors are arranged extending in respective axial directions from the weight so as to face associated fixed electrodes.

SUMMARY

The above mentioned acceleration sensors are configured such that, for instance, each fixed electrode installed on an electrostatic capacitor is connected to a substrate so as to be ultimately connected to a processing circuit that calculates acceleration from a change of electrostatic capacity. For establishing connection to a processing circuit, the acceleration sensor disclosed in Japanese Laid-Open Patent Publication No. 11-344507, for instance, is configured such that the connectors (called as supports in the Publication) for connecting fixed electrodes to a substrate are provided so as to be coupled with respective fixed electrodes at both ends of a weight. The acceleration sensor disclosed in Japanese Laid-Open Patent Publication No. 07-245413, for instance, is configured such that the connectors (called as terminals in the Publication) are provided so as to connect a substrate and fixed electrodes of respective electrostatic capacitors arranged at x-axis directional both sides of a weight and y-axis directional both sides of that.

However, use of such connectors requires preparation of through holes for establishing connection of a substrate and flat plate like fixed electrodes, which thickens fixed electrodes in comparison with other portions. Further, depending on its shape, structural environment and layout, there may be a case where a connector is set insufficiently facing an associated movable electrode. Even in a case where the connector is set sufficiently facing an associated movable electrode, effective electrostatic capacity may not be outputted due to cancellation of a change of capacity responsive to acceleration. In either case, such employment of the connector has not contributed to preferable acceleration detection.

In the above acceleration sensor, a plurality of electrostatic capacitors are separately arranged, each of which is responsible for one detection direction. Since the connector which does not contributed to acceleration detection is connected to the fixed electrode of each electrostatic capacitor, an area occupied by each electrostatic capacitor becomes large and the size of the acceleration sensor as a whole becomes large consequently.

Accordingly, it is an object in one aspect of the invention to provide an acceleration sensor capable of achieving improved sensitivity and reduction in size of the acceleration sensor.

According to one aspect of the present invention, there is provided an acceleration sensor comprising:
 a substrate;
 a weight that is movably arranged apart from the substrate; and
 an electrostatic capacitor, equipped with fixed electrodes and movable electrodes, of which electrostatic capacity varies according to distance between each of the fixed electrodes and each of the movable electrodes in a detection direction, the distance varying according to an acceleration working in the detection direction that is parallel to a flat surface direction of the substrate, wherein, the electrostatic capacitor is arranged at center of a region surrounded by a periphery of the weight in a plane view of the substrate, so that each of the fixed electrodes and each of the movable electrodes are arranged alternately in a row along the detection direction.

The above acceleration sensor includes the electrostatic capacitor of which electrostatic capacity varies according to acceleration working in the detection direction, wherein the fixed electrodes and the movable electrodes constituting the electrostatic capacitor are arranged in a row at the center of the region surrounded by periphery of the weight. More specifically, regarding the electrostatic capacitor, each of the fixed electrodes and each of the movable electrodes are arranged in alternation so as to face each other at the center of the region surrounded by periphery of the weight in the plane view of the substrate. In the above configuration, since the fixed electrodes and the movable electrodes constituting the electrostatic capacitor responsible for one detection direction are arranged in a row, the number of connectors provided for fixed electrodes can be minimized and the arrangement of the connectors can be optimized, which is more favorable in comparison to arranging fixed electrodes and movable electrodes in plural rows. Thus, the region for arranging each of the fixed electrodes and each of the movable electrodes so as to face each other, excluding places for providing connectors for those electrodes, can be secured efficiently. Consequently, an area to be occupied by the electrostatic capacitor can be made smaller, which can contribute to miniaturization of the acceleration sensor as a whole. Further, in consideration of the correlation of sensitivity and weight of the weight, by adopting the above mentioned configuration, the area saved by reducing the number of connectors can be used for a part to be added to the weight's region. Consequently, the increase of the weight's region makes it possible to make the weight heavier and improve sensitivity of the acceleration sensor in comparison with other acceleration sensors with the same electrostatic capacity.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Preferred embodiments of the present invention will be explained with reference to accompanying drawings. It is to be noted that some illustrations are depicted with dimension and reduction scale not the same as actual embodiment, for convenience of simple explanation.

Figure 1:
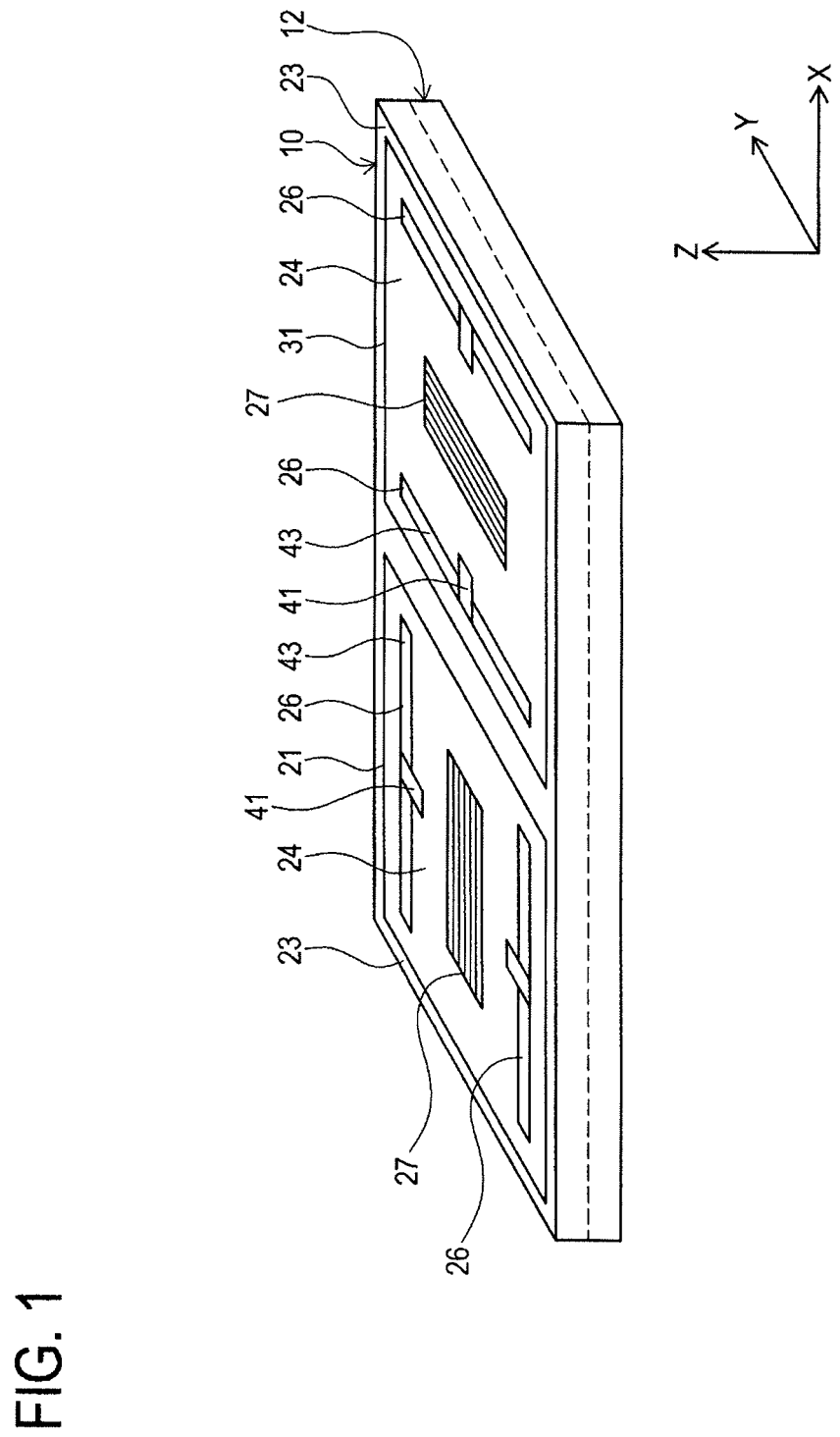
FIG. 1 is a perspective view for illustrating schematic configuration of an acceleration sensor according to an embodiment.

FIG. 1 shows schematic configuration of a chip constituting an electrostatic-capacity-type acceleration sensor of the present embodiment, which is manufactured by using MEMS (micro electro mechanical system) technology. As shown in FIG. 1, an acceleration sensor 10 includes a substrate 12 formed into a substantially rectangular shape when seen the from top. Two chip regions are arranged side by side along the long side of the substrate 12. A first sensor 21 and a second sensor 31 are formed on the two chip regions. In the explanation hereinafter, as indicated in FIG. 1, an x-direction is regarded as direction running along the long side of the acceleration sensor 10 (i.e., the direction where the first sensor 21 and the second sensor 31 are arranged side by side), a y-direction is regarded as direction perpendicular to the x-direction, i.e., the direction parallel to the short side of the acceleration sensor 10 and a z-direction is regarded as direction to make a right angle with respect to both the x-direction and the y-direction (i.e., the direction perpendicular to a plane surface of the substrate 12).

Figure 2A:
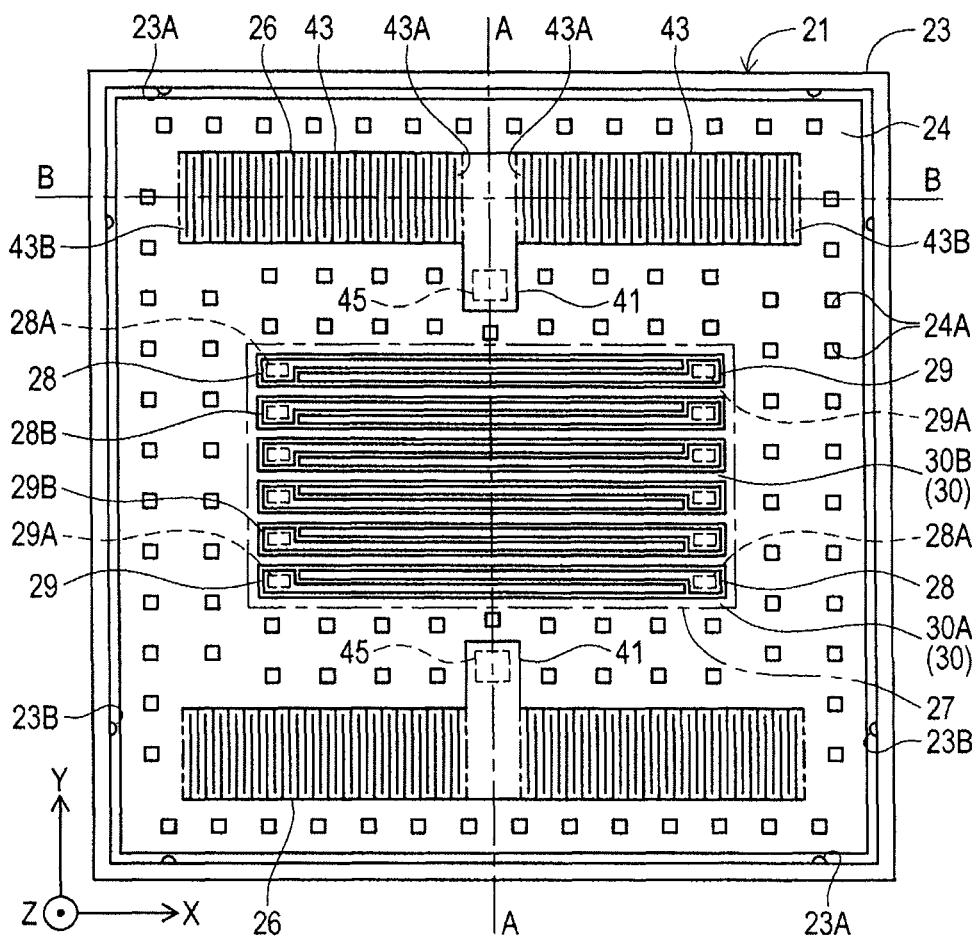
FIG. 2A is a plan view of a first sensor.

The first sensor 21 includes a frame 23, a weight 24, a pair of spring components 26 and an electrostatic capacitor 27. As shown in FIG. 2A, the frame 23 is a square frame when seen from the top and the weight 24 is disposed inside of the frame 23. The frame 23 is connected to the substrate 12 and fixed at outer periphery not shown. The weight 24 is formed like a plate having a substantially square shape when seen from the top. The weight 24 includes plural through holes 24A each penetrating through the weight 24 in the z-direction. The plural through holes 24A formed in the weight 24 are arranged in a matrix. In this connection, those through holes 24A work as air holes for reducing resist against the weight 24 in moving in the z-direction and as inlets for allowing injection of etchant used for etching a sacrificial layer to be described later.

The pair of spring components 26 are disposed in the is y-direction on both sides of the first sensor 21. Each of the pair of spring components 26 consists of: a beam 41 disposed at substantially x-directional center of the first sensor 21; and a pair of springs 43 in the x-directional both sides. The beam 41 is formed like a plate having a substantially square shape when seen from the top and arranged so that its long side should be directed in the y-direction. The weight 24 and the beam 41 are connected via the pair of springs 43. Each spring 43 has a zigzag-pattern-like shape when seen from the top, wherein a fixed end 43A at its one end is fixed to a side surface of the beam 41 and a movable end 43B at its other end is connected to the weight 24. As will be described later, the zigzag-pattern-like shape of each spring 43 is configured such that long sides and short sides are alternately connected in a series so that a long side and a short side constituting the spring 43 make a right angle. That is, respective short sides of the spring 43 are directed in the x-direction and respective long sides thereof are in the y-direction so as to form right-angled-zigzag-like pattern. Further, regarding each spring 43, distance between the fixed end 43A to be fixed to the beam 41 and the movable end 43B to be connected to the weight 24 is made longer than the long side so that stiffness in the x-direction is enhanced and elasticity in the x-direction is restricted.

Figure 2B:
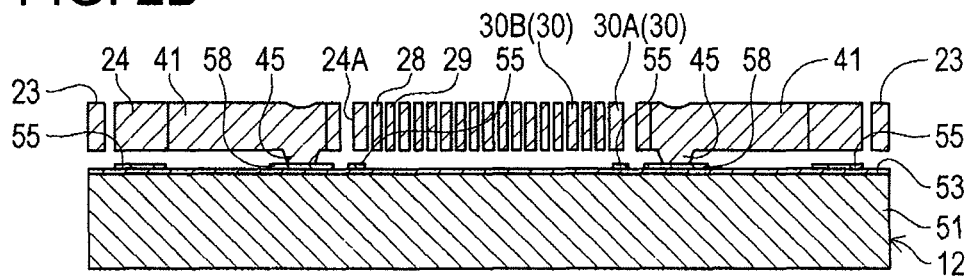
FIG. 2B is a cross-sectional view of FIG. 2A cross-sectioned along line A-A and FIG. 2C is a cross-sectional view of FIG. 2A cross-sectioned along line B-B.
Figure 2C:
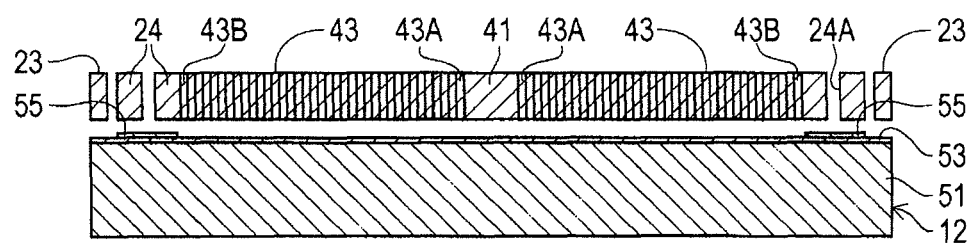

FIG. 2B is a cross-sectional view of FIG. 2A cross-sectioned along line A-A and FIG. 2C is a cross-sectional view of FIG. 2A cross-sectioned along line B-B. As shown in FIG. 2B, the beam 41 and an anchor 45 arranged upright on the substrate 12 are formed into integral structure. Therefore, as shown in FIG. 2C, the weight 24 is held by the pair of springs 43 fixed to the beam 41 at their respective one ends so that weight 24 hangs in the air over the substrate 12. Incidentally, the weight 24 and the frame 23 surrounding the weight 24 are arranged keeping space therebetween.

As shown in FIG. 2A, the frame 23 includes first stoppers 23A and second stoppers 23B at its inner periphery which keeps a predetermined distance from outer periphery of the weight 24. The first stoppers 23A are integrally formed on inner peripheral portions of the frame 23 so as to face the weight 24 in the y-axis direction. The second stoppers 23B are integrally formed on inner peripheral portions of the frame 23 so as to face the weight 24 in the x-axis direction. The first stoppers 23A and the second stoppers 23B are formed projecting inwardly from the inner periphery of the frame 23, and configured to get engaged with associated outer peripheral portions of the weight 24 when the weight 24 moves in the x-axis direction or the y-axis direction by a predetermined distance. The distance between the weight 24 and a front end of each of the first and second stoppers 23A, 23B is shorter than width 74 (refer to FIG. 4), to be described later, defined by the first fixed electrode 28, the second fixed electrode 29 and an electrode component 30 in the y-axis direction. Each of the first stoppers 23A and the second stoppers 23B has a projecting front end configured to get engaged with the weight 24, thereby an area to get contact with the weight 24 is made small for avoiding stiction. Incidentally, details on positions of the first and second stoppers 23A, 23B will be described later.

As shown in FIG. 2A, the electrostatic capacitor 27 includes first fixed electrodes 28, second fixed electrodes 29 and electrode components 30. The electrostatic capacitor 27 is arranged in substantially the center of the first sensor 21 and the weight 24. The first sensor 21 includes plural pairs (six pairs in the embodiment) of one of the first fixed electrodes 28 and one of the second fixed electrodes 29. Each of the first fixed electrodes 28 and each of the second fixed electrodes 29 are formed into a rectangular plate-like shape with its principal plane being directed in the z-direction and long side of the principal plane being directed in the x-direction. The first fixed electrodes 28 and the second fixed electrodes 29 are aligned along the y-direction so that their respective principal planes face one another.

For electrical connection of the first fixed electrodes 28 and wires (not shown) formed on the substrate 12, through holes 28A are provided at either one of x-directional sides (in FIG. 2A, upper three of them at the left side and lower three of them at the right side). Further, for electrical connection of the second fixed electrodes 29 and wires (not shown) formed on the substrate 12, through holes 29A are provided at other one of x-directional sides opposite to the x-directional sides for the first fixed electrodes 28 (in FIG. 2A, upper three of them at the right side and lower three of them at the left side). Regarding an electrode thickness of each first fixed electrode 28 (y-directional width thereof), a first connector 28B for which a through hole 28A is provided is made wider than other parts of the first fixed electrode 28. Similar to each first fixed electrode 28, regarding an electrode thickness of each second fixed electrode 29 (y-directional width thereof), a second connector 29B for which a through hole 29A is provided is made wider than other parts of the second fixed electrode 29.

As shown in FIG. 2B, the first fixed electrodes 28 and the second fixed electrodes 29 are formed apart from the substrate 12 except for their respective ends for which through holes 28A or 29A are provided. Incidentally, the entirety of each first fixed electrode 28 and the entirety of each the second fixed electrode 29 may be connected to the substrate 12 including their respective ends.

Electrode components 30 include: an external electrode 30A formed so as to surround the outer periphery of the first fixed electrodes 28 and that of the second fixed electrodes 29 when seen from the top; and a movable electrode 30B arranged at a y-axis directional space between the to first fixed electrode 28 and the second fixed electrode 29. The external electrode 30A is a square-frame-like shape formed at the center of the weight 24 in an integral structure with the weight 24 and apart from the first fixed electrodes 28 and the second fixed electrodes 29. The movable electrode 30B extends from the weight 24 so as to face both the first fixed electrode 28 and the second fixed electrode 29, wherein its principal plane is a substantially square plate directed in the z-axis direction and its long side is directed in the x-axis direction. Each movable electrode 30B is integrally formed with the weight 24 at the x-axis directional both ends thereof.

Further, each first fixed electrode 28 and each second fixed electrode 29 adjoin each other within a region between neighboring two of movable electrodes 30B in the y-axis direction. The first connector 28B is configured to be wide toward the adjoining second fixed electrode 29 so that a side parallel to the x-axis of the first fixed electrode 28 faces a side parallel to x-axis of the movable electrode 30B in a state of a straight line parallel to x-axis. The second connector 29B is configured to be wide toward the adjoining first fixed electrode 28 so that a side parallel to the x-axis of the second fixed electrode 29 faces a side parallel to x-axis of the movable electrode 30B in a state of a straight line parallel to x-axis.

Figure 3:
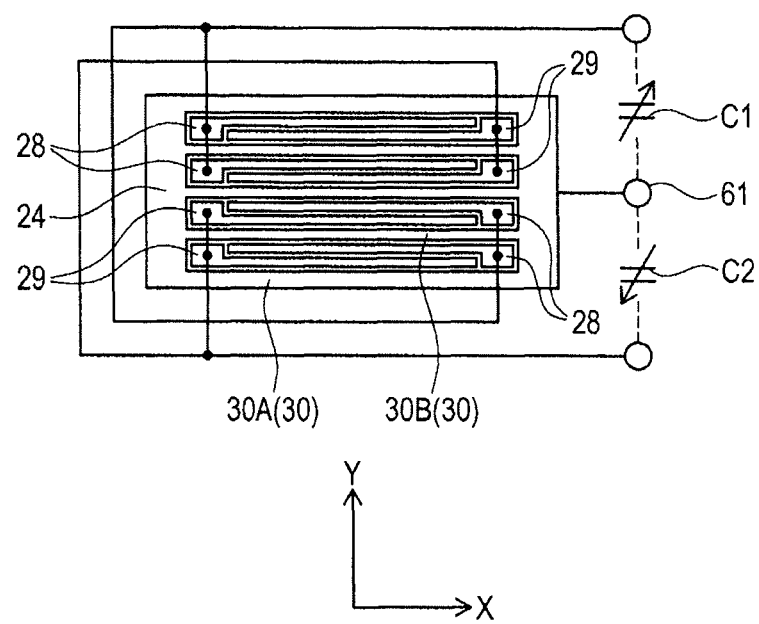
FIG. 3 is a view for illustrating electric connection of the acceleration sensor.

As shown in FIG. 2B, the substrate 12 includes: a core substrate 51; an insulating layer 53 formed to cover the top surface of the core substrate 51; and third fixed electrodes 55 each formed on the insulating layer 53. Each anchor 45 is integrally formed with a beam 41 and connected to a pad 58 and the weight 24 is electrically connected to an external terminal through wires (not shown). As shown in FIG. 3, the first sensor 21 is furnished with parallel plate capacitors C1, C2 consisting of the movable electrodes 30B of the weight 24, the first fixed electrodes 28 and the second fixed electrodes 29. Incidentally, regarding the electrode components 30 of the present embodiment, a part of the external electrode 30A facing both the first fixed electrode 28 and the second fixed electrode 29 works as a movable electrode similar to the movable electrode 30B. That is, the part of external electrodes 30A, the first fixed electrodes 28 and the second fixed electrodes 29 constitute capacitors. When the distance between the movable electrode 30B and the first fixed electrode 28 and the distance between the movable electrode 30B and the second fixed electrode 29 vary according to acceleration working in the y-axis direction with respect to the first sensor 21, the parallel plate capacitors C1, C2 vary their respective electrostatic capacity. For instance, in a case where the weight 24 moves toward one side (upward in FIG. 3) of the y-axis direction, the electrostatic capacity of the parallel plate capacitor C1 decreases whereas that of the parallel plate capacitor C2 increases. Acceleration in the y-axis direction is detected by measuring respective electrostatic capacity of the parallel plate capacitors C1, C2 both being made variable according to a change of the distance between the movable electrode 30B and the first fixed electrode 28 and a change of distance between the movable electrode 30B and the second fixed electrode 29.

For instance, a voltage value obtained at a measurement point 61 connected to the weight 24 is subsequently outputted to a processing circuit through the above mentioned external terminal so as to calculate acceleration on speed by detecting a voltage difference between the parallel plate capacitors C1, C2 (difference of electrostatic capacity). As shown in FIG. 3, the first sensor 21 is constituted as a bridge circuit inclusive of the parallel plate capacitors C1, C2 so as to make output difference between those capacitors large for improvement of sensitivity. Further, by constituting the bridge circuit, a change of electrostatic capacity at the respective capacitors C1, C2 with respect to the x-axis direction which is a direction that cannot be detected by the first sensor 21 is canceled. Thereby, sensitivity in the direction that cannot be detected can be reduced. Further, the first sensor 21 may optionally include a correction circuit for canceling an offset voltage measured at the measurement point 61, the offset voltage being a voltage detected even when load is absent due to absence of acceleration.

It is to be noted that each of the third fixed electrodes 55 indicated in FIG. 2B is widely formed on the insulating layer 53 so as to face the weight 24 in the z-axis direction. Thus, the first sensor 21 is constituted in a form of parallel plate capacitors wherein the weight 24 and the third fixed electrodes 55 are configured to face each other with respect to the z-axis direction. Those parallel plate capacitors vary their respective electrostatic capacity according to acceleration working in the z-axis direction with respect to the first sensor 21. In the first sensor 21, acceleration in the z-axis direction is detected by measuring respective electrostatic capacity of those parallel plate capacitors each being made variable according to a change of the distance between the weight 24 and each of the third fixed electrodes 55.

As described in the above, the first sensor 21 is configured to detect acceleration working in the y-axis and z-axis directions. Each of the springs 43 (see FIG. 2A) is configured not to move elastically with respect to the x-axis direction so that weight 24 should not move in the x-axis direction. Accordingly, the first sensor 21 is provided as a bi-axial acceleration sensor capable of detecting acceleration working in the y-axis and z-axis directions. As shown in FIG. 1, the second sensor 31 provided for the acceleration sensor 10 is structurally similar to the first sensor 21. That is, the second sensor 31 includes a frame 23, a weight 24, a pair of spring components 26, first fixed electrodes 28, second fixed electrodes 29 and third fixed electrodes (not shown). The second sensor 31 is similar to the first sensor 21 being rotated by 90 degrees with reference to rotation axis in the z-axis direction. That is, the second sensor 31 is configured to detect acceleration working in the x-axis and z-axis directions. Each of the springs 43 constituting the pair of spring components 26 is configured not to move elastically with respect to the y-axis direction so that weight 24 should not move in the y-axis direction. Accordingly, the second sensor 31 is provided as a bi-axial acceleration sensor capable of detecting acceleration working in the x-axis and z-axis directions.

In the thus configured acceleration sensor 10, acceleration with respect to the three axial directions is detected based on outputs from the first sensor 21 and the second sensor 31. Further, the acceleration sensor 10 detects acceleration in the z-axis direction by making the first sensor 21 and the second sensor 31 measure a change of their respective electrostatic capacity each of which is variable according to a change of distance between their respective weights 24 and their respective third fixed electrodes 55. That is, the acceleration sensor 10 detects acceleration in the z-axis direction using a value obtained by summing up outputs from the first sensor 21 and the second sensor 31.

Figure 4:
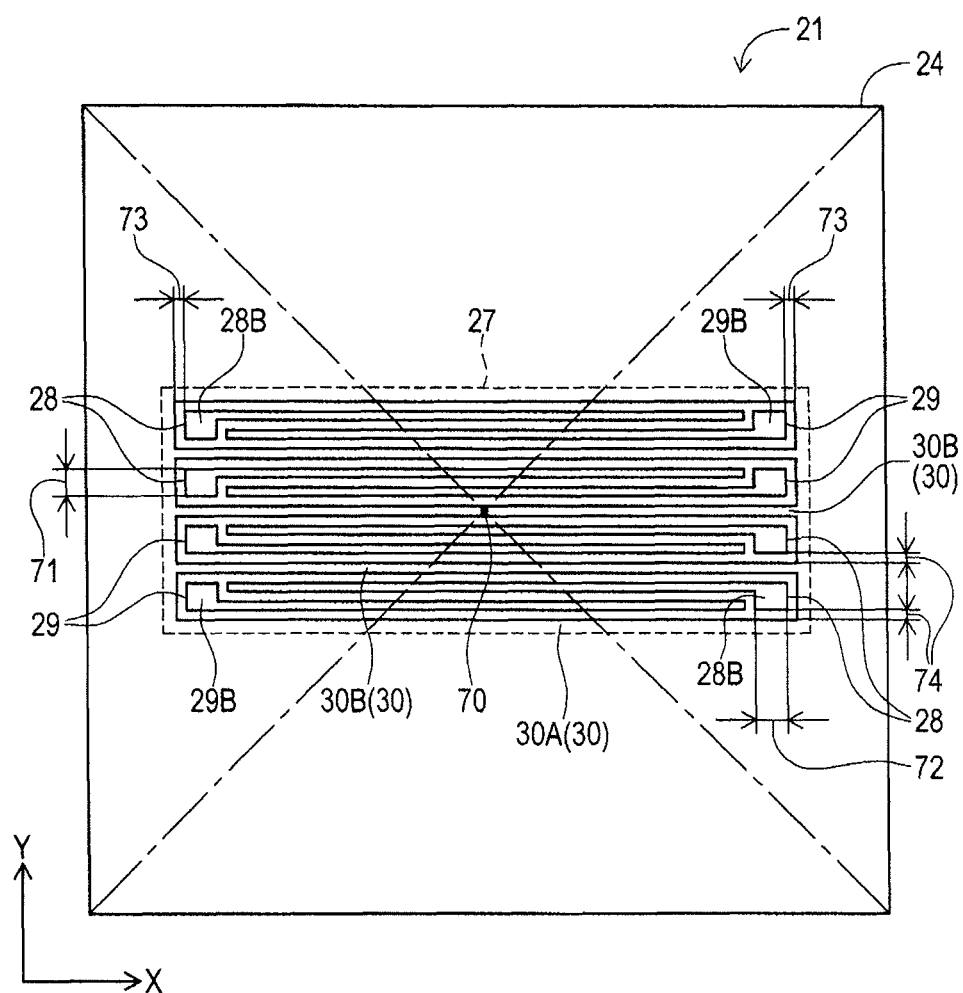
FIG. 4 is a view for illustrating arrangement of an electrostatic capacitor.

Next, an arrangement of the electrostatic capacitor 27 will be described by referring to FIG. 4. It is to be noted that FIG. 4 is a view for schematically illustrating the arrangement of the electrostatic capacitor 27 and that some constituent elements of the first sensor 21 are omitted for the convenience of concise explanation. As shown in FIG. 4, regarding the electrostatic capacitor 27, constituent elements thereof are arranged in a row at the center of the weight 24. More specifically, the electrostatic capacitor 27 is positioned so that the center of the electrostatic capacitor 27 coincides with a middle point (center of gravity 70) of a diagonal line of the weight 24 which has square periphery when seen from the top. The center of the electrostatic capacitor 27 referred to herein is the three-dimensional center of the electrostatic capacitor 27 including constituent elements associated with the first fixed electrodes 28, the second fixed electrodes 29 and the movable electrodes 30B. In this connection, center of the electrostatic capacitor 27 is set properly depending on configuration variations thereof. Regarding the first sensor 21 of the present embodiment, the center of the electrostatic capacitor 27 coincides with the center of gravity 70 of the weight 24 in the meanings of both plane and solid. In the present embodiment, the second sensor 31 is structurally identical with the first sensor 21. Therefore, the center of the electrostatic capacitor 27 of the first sensor 21 and that of the second sensor 31 coincide with the center of gravity 70 of the weight 24.

Figure 5:
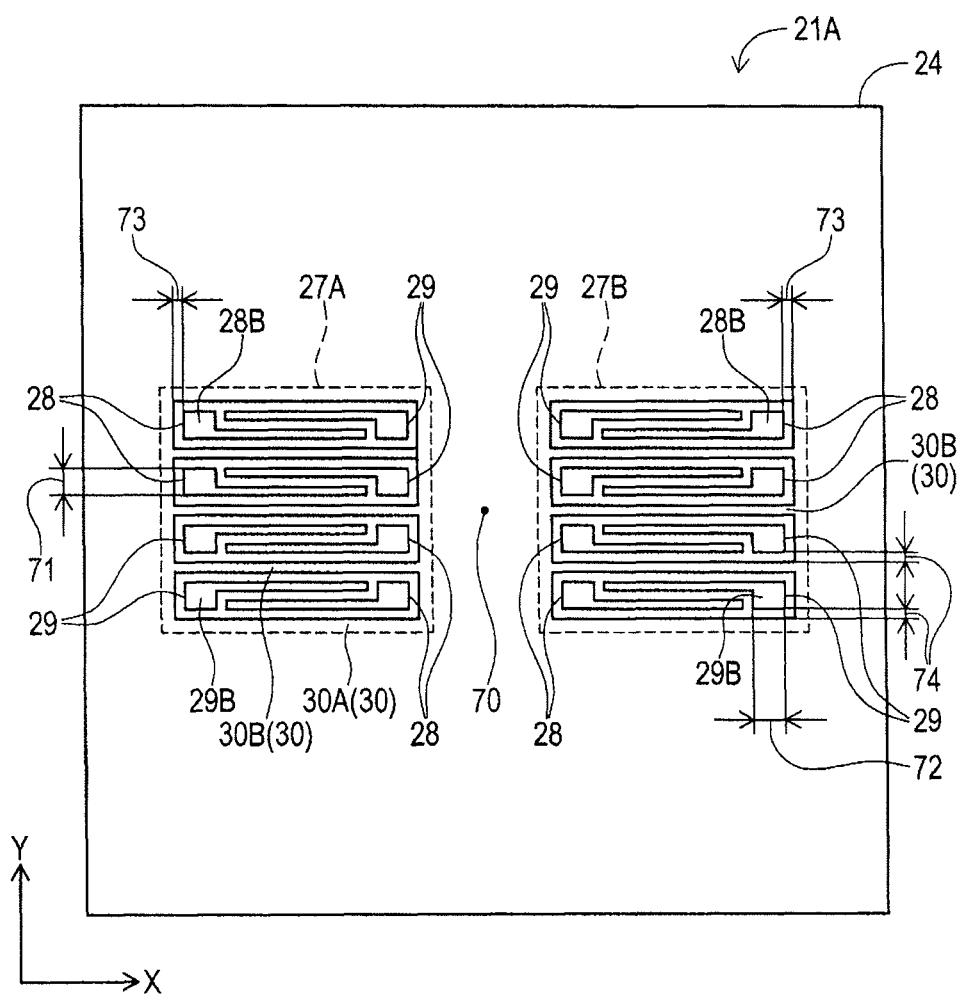
FIG. 5 is a view for illustrating arrangement of an electrostatic capacitor employed by other acceleration sensor.

Regarding the first fixed electrode 28 and the second fixed electrode 29, the though hole 28A and the through hole 29A are respectively provided for the first connector 28B and the second connector 29B so that the electrode thickness 71 at each of the first connector 28B and the second connector 29B is made larger than other portions thereof. FIG. 5 illustrates arrangement of the electrostatic capacitor 27 employed by a first sensor 21A as a comparative example. The first sensor 21A shown in FIG. 5 includes electrostatic capacitors 27A and 27B arranged in such a manner that the electrostatic capacitor 27 is separated into two parts (two rows) of the electrostatic capacitors 27A and 27B and those two parts are arranged in a long side direction (x-axis direction) of the first fixed electrodes 28 and the second fixed electrodes 29. The electrostatic capacitors 27A and 27B are separately arranged in two rows along the x-axis direction so as to be symmetric to each other with reference to the center of gravity 70 of the weight 24 when seen from the top. In the above configuration, the electrostatic capacitor 27 responsible for one detection direction (y-axis direction) is arranged so as to be separated into two parts, namely, the electrostatic capacitors 27A and 27B, wherein the first connector 28B and the second connector 29 are respectively provided for the first fixed electrode 28 of the electrostatic capacitor 27A and the second fixed electrode 29 of the electrostatic capacitor 27B.

Meanwhile, in the first sensor 21 shown in FIG. 4, the electrostatic capacitor 27 responsible for one detection direction is arranged in a row collected at center of the weight 24 and the first fixed electrode 28 and the second fixed electrode 29 and the electrode component 30 are alternately arranged in a row along the y-axis direction at the center of the weight 24. Accordingly, in comparison with the first sensor 21A shown in FIG. 5, the first sensor 21 shown in FIG. 4 can be made smaller by area saved by eliminating the first and second connectors 28B, 29B. More specifically, when the first sensor 21 and the first sensor 21A are compared in the x-axis direction and it is given that an x-axis directional length of each of the first connector 28B and the second connector 29B is defined as width 72, for instance, x-axis directional length of the first sensor 21 can be made shorter by the number of the first and second connectors 28B, 29B (two of width 72). Accordingly, in the above configuration, constituent elements of the electrostatic capacitor 27 responsible for one detection direction are intensively arranged at one area, thereby arrangement of the first connectors 28B for the fixed electrodes 28 and the second connectors 29B for the fixed electrodes 29 can be optimized and miniaturization of the sensor as a whole can be realized by reducing the number of the first and second connectors 28B, 29B.

Further, the first fixed electrodes 28 and the second fixed electrodes 29 are arranged apart from the weight 24. When the first sensor 21 and the first sensor 21A are compared in the x-axis direction and it is given that an x-axis directional length of space between the weight 24 and of each of the first connector 28B and the second connector 29B is defined as width 73, for instance, x-directional length of the first sensor 21 can be made shorter by the number of spaces (two of width 73). That is, the above configuration can eliminate gaps between the weight 24 and the first and second connectors 28B, 29B due to elimination of the first and second connectors 28B, 29B. Therefore, miniaturization can be effectively realized with respect to the acceleration sensor manufactured by implementing MEMS technology especially applied to manufacturing of fine mechanical configurations.

Further, regarding each of the first connector 288 and the second connector 29B, a y-axis directional width 74 of each of electrode components 30 (the external electrode 30A and the movable electrode 308) is made constant. As mentioned in the above, a typical sensor for detecting acceleration by using electrostatic capacitors employs a bridge circuit (refer to FIG. 3) so as to make the output difference between those capacitors large to improve sensitivity. However, the first connector 28B and the second connector 29B are positioned so as to have the same distance from the electrode component 30. Therefore, the output difference (change amount) of the capacity between the electrostatic capacitor of the first connector 28B and the electrode component 30 and the electrostatic capacitor of the second connector 29B and the electrode component 30 is canceled in a form of output through the bridge circuit. Consequently, the first connector 28B and the second connector 29B do not work as portions contributing to acceleration detection because output difference of the capacity effective in detecting acceleration is not outputted even though the first connector 28B and the second connector 29B face the electrode component 30.

Meanwhile, regarding the first sensor 21, sensitivity is correlated with weight 24. Therefore, sensitivity of the first sensor 21 can be improved by making the weight 24 heavier. Therefore, regarding the first sensor 21, size of a region for the weight 24 can be made larger by an area saved by eliminating the first connector 288 and the second connector 29B. Consequently, increase of region for the weight 24 can make the weight 24 heavier and improve sensitivity of the acceleration sensor 21 in comparison with other acceleration sensors with the same electrostatic capacity.

Incidentally, regarding the first sensor 21A shown in FIG. 5, there can be conceived of variation such that the electrostatic capacitor 27B is eliminated and integrated into the electrostatic capacitor 27A, i.e., the configuration to arrange the electrostatic capacitor 27 at position other than the center of the weight 24. However, in the above configuration, the electrode components 30 is formed in an imbalanced manner at x-axis directional one of sides with respect to the weight 24, which shifts center of gravity of the weight 24 from the center of the weight 24. Accordingly, when acceleration is added, the weight 24 is caused to make rotational movement and the acceleration sensor 21A meets difficulty in obtaining a desired output with respect to acceleration working in its detection direction.

Figure 6:
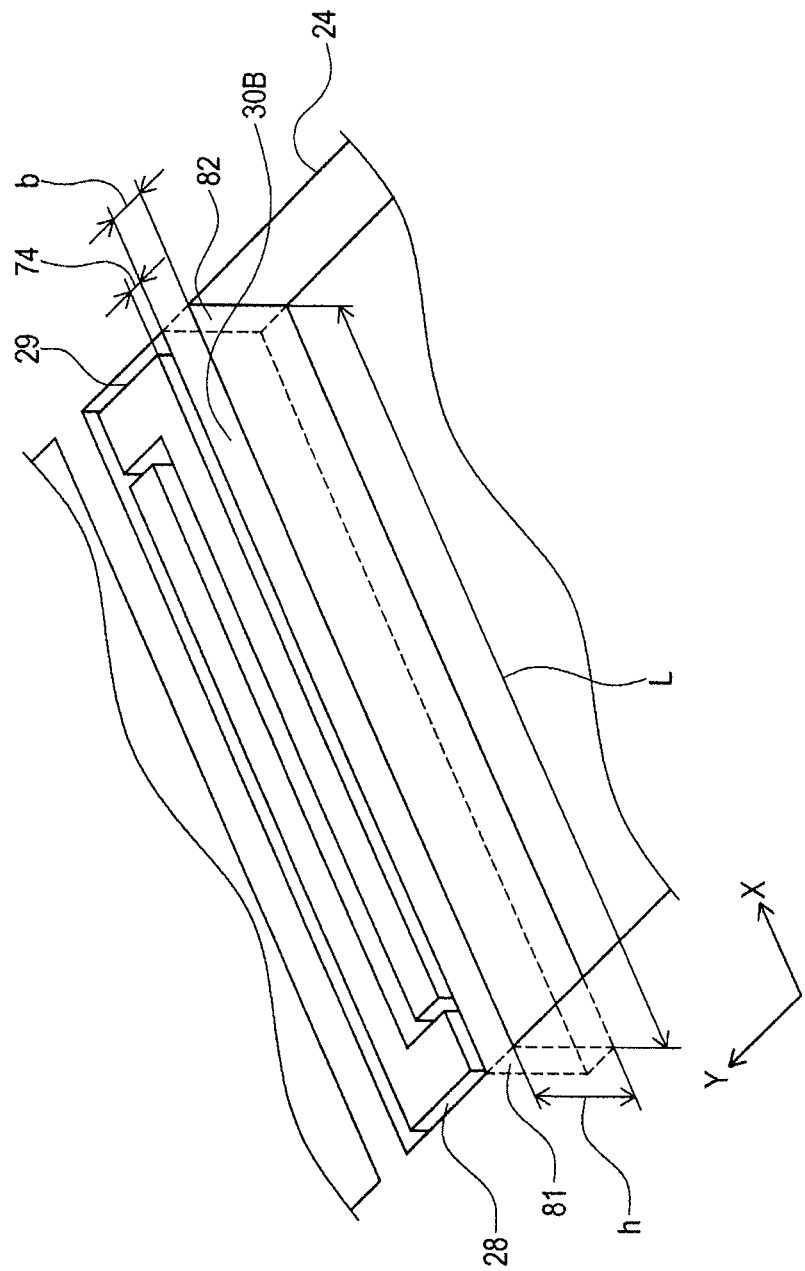
FIG. 6 is a schematic perspective for illustrating a shape of a movable electrode.

Next, there will be described on configuration of the movable electrode 30B of the electrode component 30. As shown in FIG. 6, the movable electrode 30B provided for the electrostatic capacitor 27 of the first sensor 21 is formed into a substantially rectangular plate wherein the long side is directed in the x-axis direction and both ends of the long side are fixed to the weight 24. Of the movable electrode 30B, the both ends fixed to the weight 24 are termed as fixed portions 81 and 82 which are integrally formed with the weight 24.

Here, for making comparison with the present embodiment, there will be described on comparative configuration such that one of long side ends of the movable electrode 30B, for instance, only the fixed portion 81 is fixed to the weight 24. As shown in FIG. 6, with respect to the movable electrode 30B, it is given that length in the long side direction (x-axis direction) is defined as "L", length in the short side direction (z-axis direction) is defined as "h" and thickness (y-axis directional length) is defined as "b", for instance. When acceleration "a" (G) is applied to the movable electrode 30B fixed to the weight 24 only at the fixed portion 81, distorsion (variation) expressed with the below indicated equation occurs to other end (at the side of fixed portion 82) of the movable electrode 30B.

$$v = f_0 L^4 / 8EI = 14.7(\sigma a L^4 / E b^2)$$

In the above expression, "$f_0$" stands for a load (distributed load) working on per unit length of the movable electrode 30B when acceleration a(G) is applied thereto, "E" stands for the Young's modulus of elasticity with respect to material (e.g., silicone) of the movable electrode 30B (e.g., "E" is set to 169 GPa), "I" stands for geometrical accuracy moment of inertia and "σ" stands for material density (e.g., "σ" is set to 2330 kg/m$^3$). Further, length "L" is set to 270 μm, length "h" is set to 10 μm and thickness "b" is set to 2 μm, for instance. When acceleration with a=10,000 (G) is applied to the acceleration sensor 21 in the above case, distortion with v=2.7 μm is caused.

Meanwhile, width 74 between the electrode component 30 (movable electrode 30B) and the first fixed electrode 28/the second fixed electrode 29 is dimensioned with about 2.0 μm to 2.5 μm, in view of design requirement to narrow down distance between electrodes for sensitivity improvement or limitation of stable manufacturing in the etching process. Accordingly, if acceleration of 10,000 (G) is applied to the acceleration sensor 21 with the configuration such that one end of the movable electrode 30B is fixed to the weight 24, the end of the movable electrode 30B collides with the first fixed electrode 28 or the second fixed electrode 29 and the collision causes short-circuit. Incidentally, acceleration of a=10,000 (G) is regarded as being within typical allowable range of acceleration to be applied to a sensor of this kind.

Regarding the above acceleration sensor in which the movable electrode 30B is fixed at one end and configured to extend therefrom so as to face the first and second fixed electrodes 28, 29, when acceleration is applied to the acceleration sensor, distortion caused to the movable electrode 30B becomes larger as it is closer to the not-fixed front end of the movable electrode 30B. Consequently, in a case where large acceleration is applied to the sensor due to impact, etc., for instance, the movable electrode 308 collides with the first fixed electrode 28 or the second fixed electrode 29 and the collision causes short-circuit.

On the contrary, in the first sensor 21 of the present embodiment, each of the movable electrodes 30B is connected to the weight 24 at the long side both ends, namely at the fixed portions 81 and 82. In a case where acceleration is applied to the thus configured first sensor 21, because both ends of the movable electrode 30B are fixed to the weight 24, force to get the movable electrode 30B distorted at its long side directional (x-axis directional) center portion works. In this connection, to get the center portion of the movable electrode 30B distorted, the movable electrode 30B itself needs to get deformed in an expanding manner but not in a distorting manner. Through simulation conducted by the inventor and researchers involving in this matter, acceleration of a=approximately 7,500,000 (G) has been found as acceleration to make the center portion of the movable electrode 30B expand and get in contact with the first and second fixed electrodes 28, 29. Accordingly, since both ends of the movable electrode 30B of the present embodiment are fixed to the weight 24, the movable electrode 30B can prevent itself from colliding with the first and second fixed electrodes 28, 29 even if large acceleration is applied due to impact, etc.

Further, in the first sensor 21, the electrostatic capacitor 27 is arranged at center of the weight 24 in an intensive manner. Therefore, sensitivity can be improved by making long side directional length L of a movable electrode 30B longer for the sake of larger electrostatic capacity. Meanwhile, as described in the above, in a case where the movable electrode 30B is fixed to the weight 24 at one end thereof, distortion occurs in proportion to length of L. In contrast, in the present embodiment, the movable electrode 30B is fixed to the weight 24 at both ends thereof so that distortion is hard to occur to the movable electrode 30B. Therefore, even if length L of the movable electrode 30B is made larger for desired electrostatic capacity, the movable electrode 30B with longer length L can be favorably arranged in an intensive manner.

Incidentally, the above mentioned acceleration sensor equipped with fixed electrodes and movable electrodes still involves in problems such as short-circuit, damages, etc. caused by collision between a movable electrode and a fixed electrode. That is, a movable electrode of which position moves in response to application of acceleration collides with a fixed electrode, which leads short-circuit, damages, etc. Therefore, for avoiding collision between a movable electrode and a fixed electrode, there is devised an acceleration sensor equipped with stoppers for restricting movement of a weight.

For instance, regarding the first sensor 21, it is considered possible to arrange stoppers for restricting movement of the weight 24, etc., so that movement of the weight 24 can be restricted before the electrode component 30 collides with the first and second fixed electrodes 28, 29. However, at the point of time when the stoppers work, the weight 24 already starts moving and the width 74 between the electrode component 30 and the first fixed electrode 28/the second fixed electrode 29 gets narrower than the above specified distance of 2.0 μm to 2.5 μm, for instance, and collision due to distortion is more likely to occur. Accordingly, even though the first sensor 21 is equipped with stoppers or the like for restricting movement of the weight 24, it is essential to fix both ends of the movable electrode 30B to the weight 24 for more reliable avoidance of collision between the electrode component 30 and the first fixed electrode 28/the second fixed electrode 29.

It is required that constituent elements such as stoppers for restricting movement of a weight should be arranged at proper positions depending on shape and configuration of a fixed electrode and a movable electrode. Especially, since a weight employed by a three-dimensional acceleration sensor is arranged so as to move freely along its in-plane direction, the stoppers should be arranged so as to properly work depending on the weight's positioning or tilt changeable according to acceleration speed.

Hereinafter, there will be described on another embodiment of an electrostatic-capacitor-type acceleration sensor equipped with restrictors for restricting movement of a weight so as to avoid collision of a fixed electrode and movable electrode.

Figure 7:
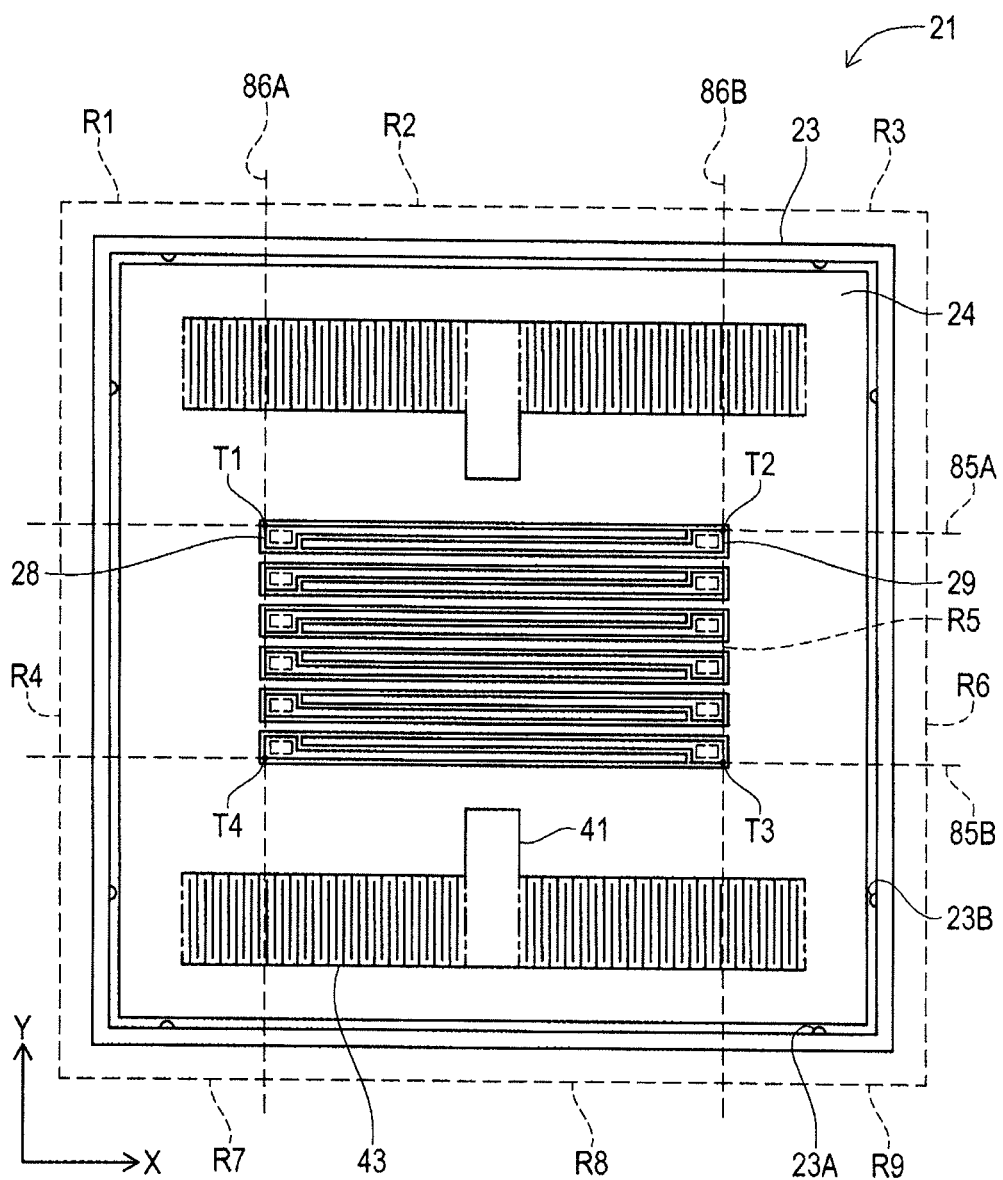
FIG. 7 is a view for illustrating arrangement of stoppers.

Firstly, there will be described on arrangement of first stoppers 23A and second stoppers 23B in detail by referring to FIG. 7. In the present embodiment, positions of the first stoppers 23A and the second stoppers 23B are determined according to positions of the first fixed electrodes 28 and the second fixed electrodes 29. To be more specific, as shown in FIG. 7, with respect to the substantially rectangular shape defined by the first and second fixed electrodes 28, 29 when the substrate 12 (refer to FIG. 1) is seen from the top, apexes of the rectangular shape are defined as end points T1 through T4. Those end points T1 through T4 are set in clockwise order from the upper left apex. Thereby, the rectangular frame defined by connecting the end points T1 through T4 is regarded as a rectangular frame surrounding the entirety of the first and second fixed electrodes 28, 29 and the long lines and the short lines are respectively directed in the x-axis direction and the y-axis direction when seen from the top. Incidentally, positions of T1 though T4 may be changed properly as long as the entirety of the first and second fixed electrodes 28, 29 is enclosed within a rectangular frame defined by connecting the end points T1 through T4.

In the present embodiment, the end points T1 and T2 are regarded as the x-axis directional ends at one of the y-axis directional ends (uppermost ends in FIG. 7) of the first and second fixed electrodes 28, 29 when the substrate 12 is seen from the top. Further, the end points T3 and T4 are regarded as the x-axis directional ends at the other one of the y-axis directional ends (lowermost ends in FIG. 7) of the first and second fixed electrodes 28, 29 when the substrate 12 is seen from the top. Further, the end points T1 and T4 are regarded as the y-axis directional ends at one of the x-axis directional ends of the first and second fixed electrodes 28, 29. Further the end points T2 and T3 are regarded as the y-axis directional ends at the other one of the axis directional ends of the first and second fixed electrodes 28, 29.

Next, a line passing though the end points T1 and T2 is defined as a first line 85A and a line passing through the end points T3 and T4 is defined as a first line 85B. Regarding the first sensor 21 of the present embodiment, the first line 85A and the first line 85B are lines parallel with the x-axis direction. Further, a line passing through the end points T1 and T4 is defined as a second line 86A and a line passing through the end points T2 and T3 is defined as a second line 86B. Regarding the first sensor 21 of the present embodiment, the second line 86A and the second line 86B are lines parallel with the y-axis direction. By using the first lines 85A, 85B and the second lines 86A, 86B, the first sensor 21 seen from the top is divided into nine regions which are defined as regions R1 through R9 in order (from upper left to lower right in FIG. 7).

In the above definition, a region R5 is a middle region where the first and the second fixed electrodes 28, 29 are arranged when the first sensor 21 is seen from the top. Regions R2 and R8 are next to the region R5 in the y-axis direction. Regions R4 and R6 are next to the region R5 in the x-axis direction. The rest of the four regions R1, R3, R7 and R9 are regions other than R2, R4, R6 and R8 that adjoin the region R5. Regarding the first sensor 21 of the present embodiment, the first stoppers 23A and the second stoppers 23B are arranged on the frame 23 at parts belonging to the above-mentioned four regions R1, R3, R7 and R9. The first stoppers 23A and the second stoppers 23B are positioned symmetrically with reference to the center of gravity of the weight 24. Incidentally, each of the stoppers 23A, 23B may be positioned asymmetrically with reference to the center of gravity of the weight 24.

Figure 8:
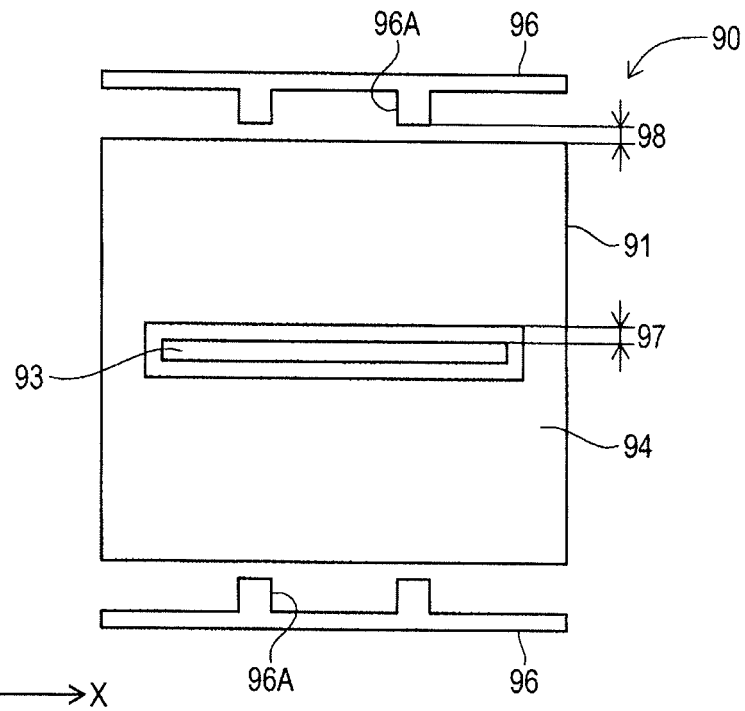
FIG. 8 is a view for illustrating arrangement of stoppers used in a sensor directed to a comparative example.
Figure 9:
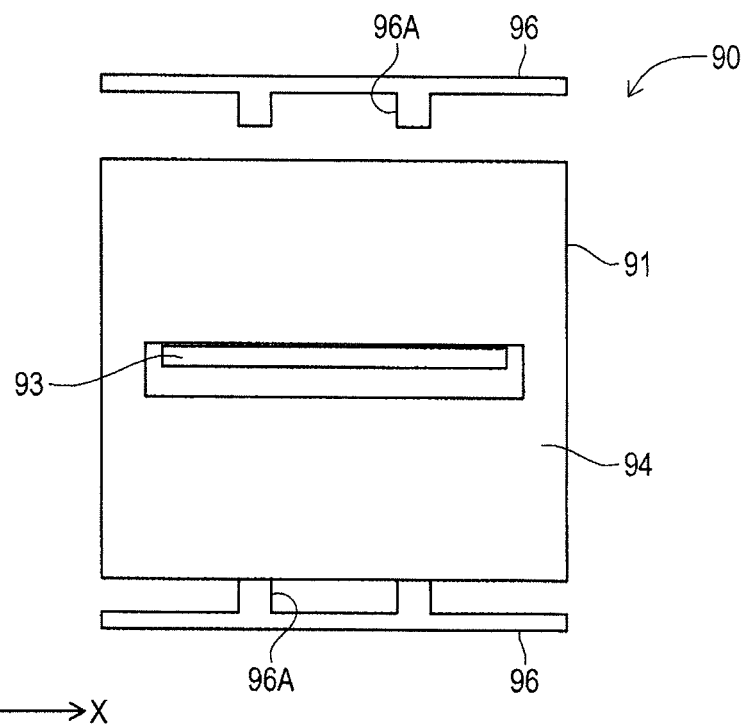
FIG. 9 is a view for illustrating operation of the sensor directed to the comparative example.
Figure 10:
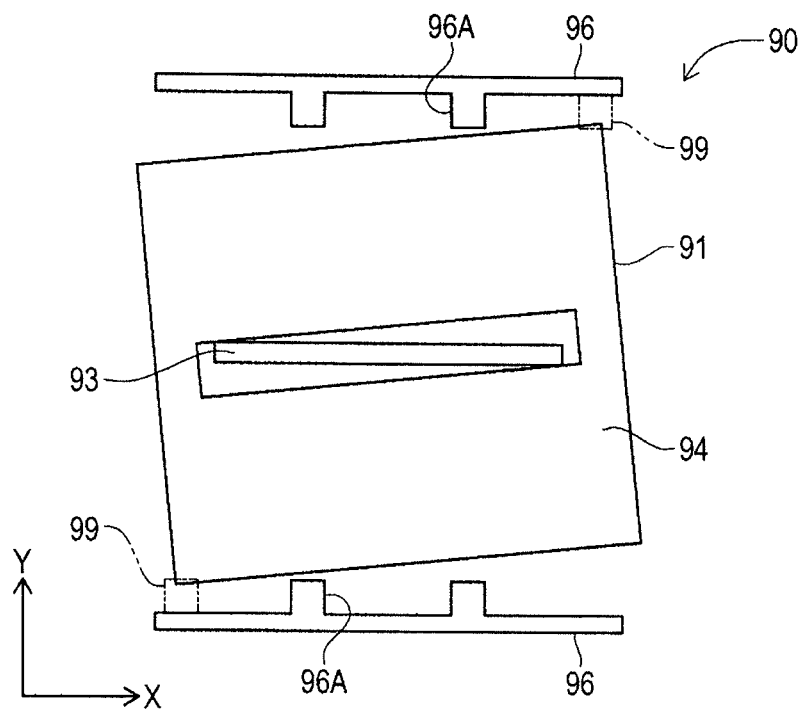
FIG. 10 is a view for illustrating operation of the sensor directed to the comparative example.

Next, there will be described on the effects in a case where the first stoppers 23A and the second stoppers 23B are arranged at the regions R1, R3, R7 and R9 by referring to FIG. 8 through FIG. 10. Each of FIG. 8 through FIG. 10 schematically shows a sensor as a comparative example in which some constituent elements are properly omitted and only one fixed electrode is provided for concise explanation. An acceleration sensor 90 shown in FIG. 8 is configured such that a fixed electrode 93 is arranged at center of a weight 91 so as to be directed in the x-axis direction and an electrode component 94 is arranged so as to surround the fixed electrode 93. For the acceleration sensor 90, frames 96 are provided at positions facing the weight 91 in the y-axis direction. For each of the frames 96, stoppers 96A are provided at positions facing the fixed electrode 93 in the y-axis direction. In other words, the stoppers 96A are arranged at an x-axis directional range where the fixed electrode 93 stretches so as to face the stoppers 96A in the y-axis direction.

Further, a y-axis directional distance between the fixed electrode 93 and the electrode component 94 is defined as width 97. Here, the width 97 is the same as the width 74 (refer to FIG. 4) in length. It is preferable to make width 97 narrower for improving sensitivity. Further, distance between a front end of the stopper 96A and the weight 91 is defined as width 98. The width 98 is made shorter than the width 97 for avoiding collision between the fixed electrode 93 and the electrode component 94. It is preferable that the width 98 is set to minimum length feasible according to limitation of stable manufacturing and the width 97 is made slightly longer than the width 98.

Next, FIG. 9 illustrates a situation that y-axis directional acceleration is applied to the acceleration sensor 90 and the weight 91 is caused to move (downward in FIG. 9). In this case, the weight 91 gets engaged with the stoppers 96A at lower-side periphery thereof so that movement of the weight 91 is restricted before the electrode component 94 collides with the fixed electrode 93. In a case where the weight 91 makes parallel movement in the y-axis direction, the weight 91 (the electrode component 94) approaches the fixed electrode 93 at distance corresponding to difference between the width 97 (refer to FIG. 8) and the width 98, and stops.

In practical use of the acceleration sensor 90, there is assumed a case such that acceleration working in a direction other than detection direction (y-axis direction in this case) is applied to the acceleration sensor 90. For instance, in a case where large impact is applied to the acceleration sensor 90 as shown in FIG. 10, x-axis directional acceleration works in addition to y-axis directional acceleration and the weight 91 is caused to rotate with reference to the z-axis (counterclockwise rotation in FIG. 10). In that case, different from the situation shown in FIG. 9, y-axis directional distance between the electrode component 94 and the fixed electrode 93 varies depending on x-axis directional position of the electrode component 94. This is because y-axis directional movement amount inclusive of rotational movement of the weight 91 increases in proportion to distance from rotation center. The rotation center mentioned herein with respect to the configuration of the acceleration sensor 90 corresponds to the center of the weight 91 as well as the x-axis directional middle point of the fixed electrode 93. Accordingly, as the electrode component 94 departs from the x-directional middle point of the fixed electrode 93, y-directional movement amount of the weight 91 increases and distance between the electrode component 94 and the fixed electrode 93 becomes narrower.

Further, regarding the acceleration sensor 90, both ends of the fixed electrode 93 are positioned exterior to the stoppers 96A with reference to the x-axis direction. The above positioning allows such a situation that y-axis directional movement amount of the weight 91, i.e., movement amount the weight 94 makes with reference to the both ends of the fixed electrode 93, becomes larger than movement amount the weight 91 makes with reference to the stoppers 96A. Thereby, the both ends of the fixed electrode 93 collide with the electrode component 94.

Meanwhile, the first stoppers 23A of the present embodiment shown in FIG. 7 are arranged at the regions R1, R3, R7 and R9 all of which are positioned so as not to face the first and second fixed electrodes 28, 29 with reference to y-axis direction. Positions of the first stoppers 23A are supposed to be positions of stoppers 99 indicated with a long dashed double-short dashed line in FIG. 10, for instance. The positions of the stoppers 99 are where the weight 91 reaches when y-axis directional movement amount the weight 91 makes along rotation is larger than movement amount the weight 91 makes with reference to the both ends of the fixed electrode 93. Therefore, the thus positioned stoppers 99 get engaged with the weight 91 before the both ends of the fixed electrode 93 collide with the electrode component 94 so as to avoid collision. That is, the first sensor 21 of the present embodiment can reliably avoid collision between the electrode component 30 and the first fixed electrode 28/the second fixed electrode 29 by optimizing positions of the first stoppers 23A.

As the method for avoiding collision with the acceleration sensor 90 shown in FIG. 8, there can be considered configuration to make the distance between the stoppers 96A and the weight 91 (width 98) much shorter in comparison with the distance between the fixed electrode 93 and the electrode component 94 (width 97). However, in the above configuration, for instance, in a case where the width 98 is set to shortest length feasible according to limitation of stable manufacturing in manufacturing process, length of the width 97 has to be made considerably longer than shortest length of width 98 feasible according to limitation of stable manufacturing in manufacturing process, which makes difficult to improve sensitivity up to desired level.

On the other hand, the first acceleration sensor 21 of the present embodiment can be configured such that the distance between the first stoppers 23A and the weight 24 (width 98 in FIG. 8) is set to shortest length feasible according to limitation of stable manufacturing in manufacturing process while the distance between the electrode component 30 and the first fixed electrode 28/the second fixed electrode 29 (width 97 in FIG. 8) is made a bit longer than the width 98. That is, the above configuration makes it possible to approximate the distance between the fixed electrode 93 and the electrode component 94 to shortest length is feasible according to limitation of stable manufacturing in manufacturing process for improvement of sensitivity.

Although the above explanation focuses on the effect brought by the first stoppers 23A in the y-axis direction, the effect brought by the second stopper 23B in the x-axis direction is similar with the effect by the first stoppers 23A. That is, in similar with the y-axis directional movement, when the weight 24 makes rotation, distance between the electrode component 30 and the first fixed electrode 28/the second fixed electrode 29 in x-axis direction also relatively varies. Therefore, by arranging the second stoppers 23B at positions exterior to the first and the second fixed electrodes 28, 29 with reference to the y-axis direction, the second stoppers 23B in addition to the first stoppers 23A can reliably avoid collision between the fixed electrode 93 and the electrode component 94 even when the weight 24 makes rotational movement.

Figure 11:
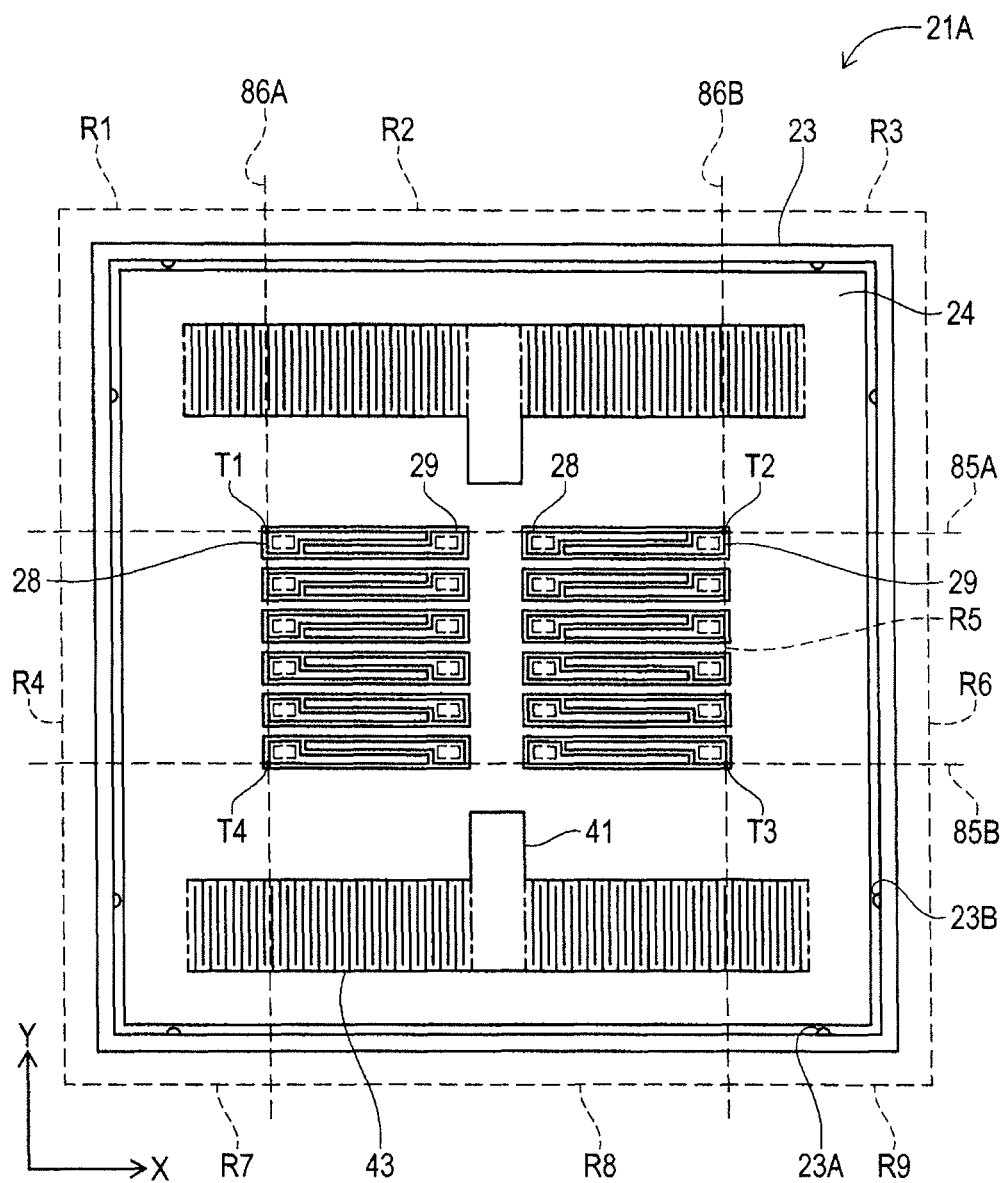
FIG. 11 is a view for illustrating arrangement of stoppers used in other sensor.

Regarding the first sensor 21A shown in FIG. 5 as a comparative example, the first stoppers 23A and the second stoppers 23B can be arranged in the same positioning manner. For instance, as shown in FIG. 11, regarding the first fixed electrodes 28 and the second electrodes 29 separately arranged in two rows in the long side direction of the first sensor 21A, outer periphery of the first and second fixed electrodes 28, 29 in the two rows when seen from the top is assumed as a rectangular shape and four apexes of the rectangular shape are defined as end points T1 through T4. With reference to the end points T1 through T4, first lines 85A, 85B second lines 86A, 86B and regions R1 through R9 are defined. Even if positions of the first stoppers 23A and the second stopper 23B are determined in accordance with the thus set regions R1 through R9, collision between the electrode component 30 and the first fixed electrode 28/the second fixed electrode 29 can be avoided reliably.

Figure 12A:
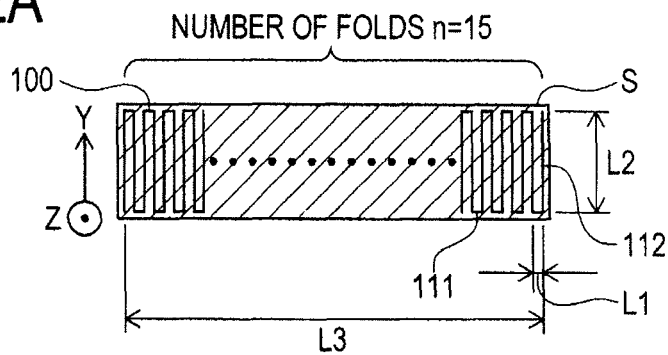
FIG. 12A is a view for illustrating a spring used in the embodiment and FIG. 12B and FIG. 12C are views for illustrating springs of comparative examples.
Figure 12B:
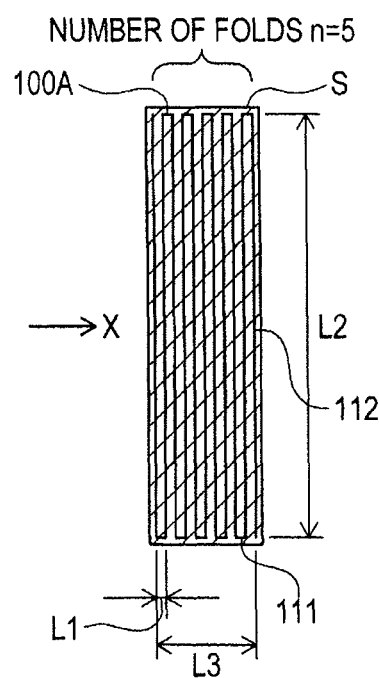
Figure 12C:
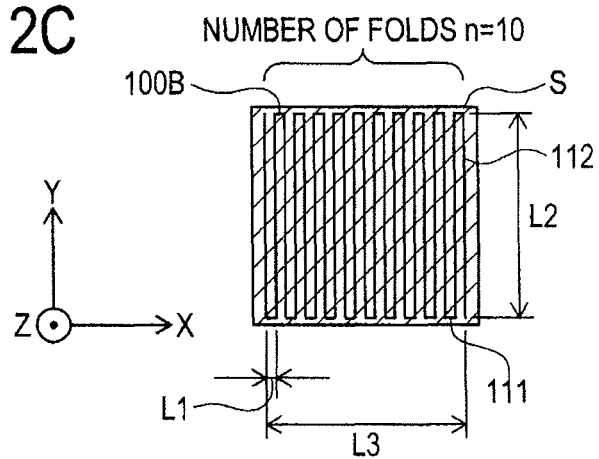

Next, there will be described on configuration of the spring 43. A spring 100 illustrated in FIG. 12A is an example of the spring 43. As is already mentioned, the spring 100 is configured such that short sides 111 and long sides 112 are alternately connected in a series so that a short side 111 and a long side 112 constituting the spring 100 make a right angle. In the following description, as shown in FIG. 12A through FIG. 12C, length of the short side 111 and that of the long side 112 will be referred to as L1 and L2, respectively. Further, directions indicated with arrows in FIG. 12A through FIG. 12C show direction where respective springs 100, 100A and 100B elastically move.

The spring 100 is configured such that L2 is longer than L1 and L2 is shorter than length L3 which is end-to-end length of the spring 100 to be connected to the weight 24 (see FIG. 2A) and the beam 41 (see FIG. 2A). Here, it is supposed that n stands for the number of turns at the y-axis direction to make a shape of the spring 100, i.e., the number of turns made at either one of y-axis directional ends (termed as "number of folds" hereinafter). Here, 15 is the number of folds to make the shape of the spring 100 shown in FIG. 12A. Regarding the spring 100, there is correlation between the number of folds n and an x-axis directional spring constant Kx, a y-axis directional spring constant Ky and a z-axis directional spring constant Kz. Through evaluations and simulation with respect to changes of spring constants Kx, Ky, Kz each of which is changeable depending on the number of folds n, the inventor and researchers involving in this matter have reached the idea of the present invention. More specifically, as shown in FIG. 12A, under the condition wherein an area to be occupied by the spring 100 should be constant, i.e., a superficial area S (indicated with hatching in FIG. 12A) to be occupied by the spring 100 in a plane perpendicular to the z-axis direction should be constant while the number of folds n is changed, evaluations on changes of spring constants Kx, Ky, Kz were carried out.

Figure 13:
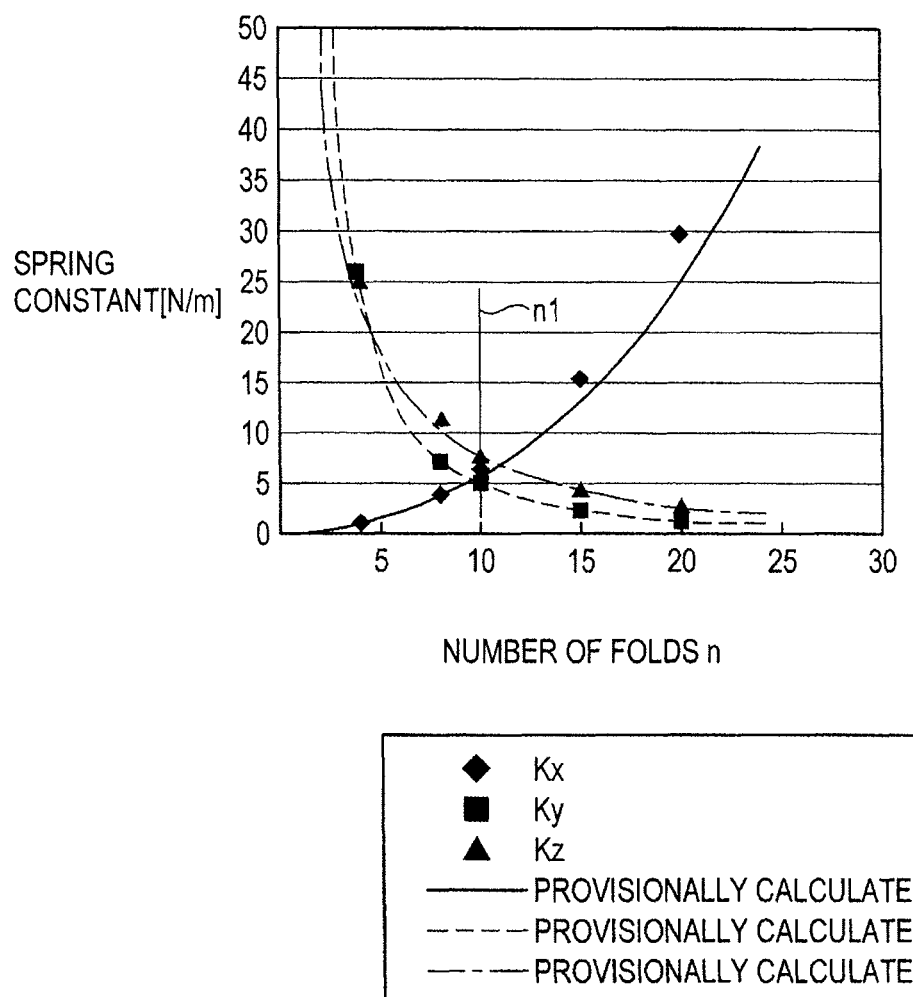
FIG. 13 is a graph for illustrating relation of spring constant and the number of folds.

FIG. 13 is a graph showing respective spring constants Kx, Ky, Kz with reference to the number of folds n. As shown in FIG. 13, the x-axis directional spring constant Kx increases as the number of folds n increases. The graph indicated with solid line shows a result of calculations of the x-axis directional spring constant Kx. From the graph of Kx, it is found that stiffness in the x-axis direction is enhanced and elasticity in the x-axis direction is restricted as the number of folds n increases.

Meanwhile, the y-axis directional spring constant Ky decreases as the number of folds n increases. The graph indicated with broken line shows a result of calculations of the y-axis directional spring constant Ky. From the graph of Ky, it is found that stiffness in the y-axis direction is weakened and the spring is made to move more easily in the y-axis direction as the number of folds n increases. In similar with Ky, the z-axis directional spring constant Kz decreases as the number of folds n increase. The graph indicated with long dashed short dashed line shows a result of calculations of the z-axis directional spring constant Kz. From the graph of Kz, it is found that stiffness in the z-axis direction is weakened and the spring is made to move more easily in the z-axis direction as the number of folds n increases.

Based on the above evaluation results and the graph shown in FIG. 13, the spring 100 shall be classified into three types depending on spring constants Kx, Ky, and Kz. For instance, given that the number of folds n that approximates the spring constants Kx, ky and Kz to a substantially equivalent value is defined as reference value n1 (for instance n1=10), a spring 100 classified as "type 1" is configured such that the number of folds n is smaller than the reference value n1. For instance, as shown in FIG. 12B, a spring 100A of which number of folds n is 5 is classified into the "type 1" spring. The spring 100A is configured such that end-to-end length L3 thereof is shorter than length L2, thereby the spring 100A is made to move in the x-axis direction easily and elastic movement in the y-axis direction is restricted. That is, the spring 100A is elastic in one direction and corresponds to a type of the spring employed by the uniaxial acceleration sensor disclosed in Japanese Laid-Open Patent Publication No. 11-344507.

Next, a spring 100 classified as type 2 is configured such that the number of folds n is the same as the reference value n1 and the spring constants Kx, Ky and Kz approximate to a substantially equivalent value. For instance, as shown in FIG. 12C, a spring 100B of which number of folds n is 10 is classified into the "type 2" spring. The spring 100B is configured such that end-to-end length L3 thereof is almost the same as length L2, thereby the spring 100B is made to move in any of the x-axis, y-axis and z-axis directions. That is, the spring 100B is elastic and movable in any of the x-axis, y-axis and z-axis directions and corresponds to a type of the spring employed by the three-dimensional acceleration sensor disclosed in Japanese Translation of PCT International Patent Application No. 2005-534016.

The spring 100 shown in FIG. 12A is classified as "type 3" spring which is configured such that the number of folds n is larger than the reference value n1. The spring 100 exhibits movability in two directions. More specifically, the spring 100 is stiff in the x-axis direction at which a short side 111 and a long side 112 in a series make turn like a zigzag pattern. Therefore, the spring 100 is difficult to move elastically in the x-axis direction. Further, the spring 100 is movable in the y-axis direction which is perpendicular to the x-axis direction where the spring makes turns in a zigzag manner. Also, the spring 100 is movable in the z-axis direction which is perpendicular to the plane in which the area S to be occupied by the spring 100 is set. Accordingly, concerning the first sensor 21 that employs the spring 100 (equivalent to spring 43) exhibiting the above mentioned properties, acceleration working in the y-axis direction and acceleration working in the z-axis direction are detected whereas the weight is not allowed to move in the x-axis direction so as to suppress sensitivity of acceleration in the not-to-be detected detection, i.e., the x-axis direction. Thereby, detection accuracy can be improved.

Next, there will be described on sensitivity of the thus configured acceleration sensor 10. The acceleration sensor 10 is configured to detect acceleration in the z-axis direction using outputs from the first and second sensors 21 and 31. Given that area of movable electrodes facing fixed electrodes in the z direction of the first and second sensors 21 and 31 is defined as "S", distance between the electrodes as "d" and conductivity as "ε", electrostatic capacity C is expressed with the below indicated equation.

$$C=\epsilon S/d \qquad (1)$$

The weight 24 is formed into a plate-like shape of which plane surface is directed perpendicular to the z-axis direction. Therefore, the area S of the movable electrode for detecting acceleration in the z-axis direction can be made larger in comparison with others for detecting acceleration in other directions (x-axis and y-axis directions). Accordingly, concerning each of the first sensor 21 and the second sensor 31 of the present embodiment, scale of electrostatic capacity for detecting acceleration in the z-axis direction can be made large in the other directions.

By using the above equation (1), degree of electrostatic capacity variation "ΔC" to distance variation "Δd" can be expressed with the below indicated equation.

$$\Delta C/\Delta d=\epsilon S/d^2 \qquad (2)$$

Further, in view of equations of motion and the law of elasticity, force working on the weight 24 can be expressed with the below indicated equation.

$$F=ma=k\Delta d \qquad (3)$$

(m: mass of weight 24, a: acceleration, k: spring constant)

In view of the above equations (2), (3), electrostatic capacity variation "ΔC" can be expressed with the below indicated equation.

$$\Delta C=(\epsilon S/d^2 * m/k)a=(C/k*m/d)a \qquad (4)$$

Accordingly, judging from the above equation (4), the following means can be conceived for enhancing sensitivity to acceleration "a" (electrostatic capacity variation) that the electrostatic-capacity-type acceleration sensor 10 of the present embodiment should hold. The particular means are: increasing mass "m" of the weight 24; increasing electrostatic capacity "C" of the capacitor consisting of the weight 24, the first fixed electrodes 28, the second fixed electrodes 29 and the third fixed electrodes 55; or lowering the respective spring constants Kx, Ky, Kz. In this connection, the mass "m" is correlated with size of the weight 24 and the electrostatic capacity "C" is correlated with an area "S" of movable electrodes of which plane is directed perpendicular to the z-axis direction of the weight 24. As shown in FIG. 2A, it is the weight 24 that occupies most part of plane area of the acceleration sensor 10 when seen from the top. Meanwhile, as exemplary configuration of multi-axial acceleration sensor consisting of plural uniaxial acceleration sensors (such as acceleration sensor disclosed in Japanese Laid-Open Patent Publication No. 11-344507) for detecting each of the x-axis, y-axis and z-axis directions, there may be conceived of the configuration to arrange plural acceleration sensors on the same plane. However, when the configuration of acceleration sensor disclosed in Japanese Laid-Open Patent Publication No. 11-344507 is seen from the top, it is found that the weight involving in the z-axis directional acceleration detection occupies a small a part in the plane view of the configuration. That is, the acceleration sensor 10 of the present embodiment is configured such that all of the sensors (the first sensor 21 and the second sensor 31) installed therein cover acceleration in the z-axis direction. Therefore, the acceleration sensor 10 of the present embodiment can achieve excellence in miniaturizing its dimension in comparison with a different-type three-dimensional acceleration sensor of which sensitivity of acceleration in the z-axis direction is the same as that of the present embodiment.

Concerning sensitivity of an electrostatic-capacity-type acceleration sensor, generally, substantially equal sensitivity in each of x-axis, y-axis and z-axis directions is favorable. From the equation (4), for realizing substantially equal sensitivity in each of x-axis, y-axis and z-axis directions, it is possible to equalize ratio of electrostatic capacity C and spring constant k with respect to each of x-axis, y-axis and z-axis directions. For instance, hereinafter, there will be described given that the following definitions are applied to the above mentioned acceleration sensor 10. Firstly, concerning the second sensor 31 for detecting acceleration in the x-axis direction, there are given definitions such that "Cx" stands for electrostatic capacity between the weight 24 and the first and second fixed electrodes 28 and 29, and "kx" stands for a spring constant of the second sensor 31 with respect to the x-axis direction. Secondly, concerning the first sensor 21 for detecting acceleration in the y-axis direction, there are given definitions such that "Cy" stands for electrostatic capacity between the weight 24 and the first and second fixed electrodes 28 and 29, and "ky" stands for a spring constant of the first sensor 21 with respect to the y-direction. Since the first sensor 21 and the second sensor 31 of the present embodiment are structurally identical, electrostatic capacity Cx and the x-axis directional spring constant kx set for the first sensor 21 are respectively substantially the same as electrostatic capacity Cy and the y-axis directional spring constant ky set for the second sensor 31. Concerning the first sensor 21 for detecting acceleration in the z-axis direction, there are further given definitions such that "Cz1" stands for electrostatic capacity between the weight 24 and the third fixed electrode 55, and "kz1" stands for a spring constant of the spring 43 with respect to the z-axis direction. Concerning the second sensor 31 for detecting acceleration in the z-axis direction, there are further given definitions such that "Cz2" stands for electrostatic capacity between the weight 24 and the third fixed electrode 55, and "kz2" stands for a spring constant of the spring 43 with respect to the z-axis direction. Since the first sensor 21 and the second sensor 31 of the present embodiment are structurally identical, electrostatic capacity Cz1 and the spring constant kz1 set for the first sensor 21 are respectively substantially the same as electrostatic capacity Cz2 and the spring constant kz2 set for the second sensor 31.

To make the ratio between electrostatic capacity C and spring constant k of each direction equal, it is required to satisfy the below indicated equation.

$$2*Cx/kx=2*Cy/ky=(Cz1/kz1+Cz2/kz2) \quad (5)$$

Accordingly, by designing a sensor so as to approximate its electrostatic capacity and spring constant to those satisfying the above equation (5), sensitivity of acceleration in each of the three axial directions perpendicular to one another can be made similar and designing the acceleration sensor 10 can be simplified. Incidentally, as shown in FIG. 3, each of the first sensor 21 and the second sensor 31 is constituted in a form of a bridge circuit inclusive of the parallel plate capacitors C1, C2 so as to calculate acceleration speed by using electrostatic capacity difference between capacitor C1 and capacitor C2. Accordingly, for each of the sensors 21 and 31, sensitivity of each direction is correlated with a doubled value of capacity directed to either one of the capacitors C1, C2. Thus, the above equation (5) is established in consideration of characteristics of a bridge circuit used for an electrostatic-capacitor-type acceleration sensor.

Next, an exemplary manufacturing method of the first sensor 21 will be described. Incidentally, description about a manufacturing method of the second sensor 31 will be omitted as being similar with manufacturing method of the first sensor 21.

Figure 14A:
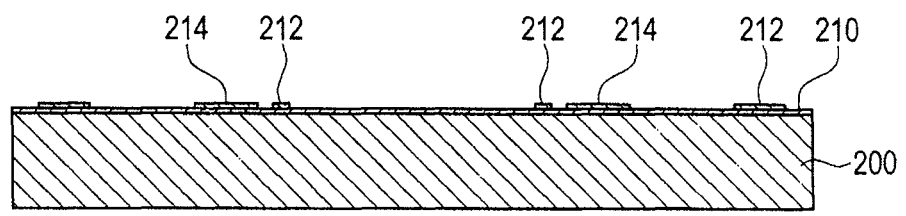
FIG. 14A, FIG. 14B and FIG. 14C are cross-sectional views for illustrating manufacturing process of the acceleration sensor.

Firstly, a core substrate 200 shown in FIG. 14A is prepared. The core substrate 200 is a wafer made of single crystal silicone, for instance. Considerable number of sensor elements are formed on the core substrate 200 and dicing treatment is subsequently applied, whereby plural first sensors 21 are singulated therefrom.

An insulating layer 210 is formed on a top surface of the core substrate 200. The insulating layer 210 is made of silicon nitride (SiNx) or a film obtained by laminating silicon nitride on a silicon dioxide film by using thermal oxidation method or deposition method, for instance. Next, on the top surface of the insulating layer 210, there are subsequently formed the third fixed electrodes 212 arbitrarily patterned by using photolithography technology, pads 214, and not-shown wires. The third fixed electrodes 212 and wires (not shown) are made by using polysilicon or such like material which exhibits resistance property against etching of a later-described sacrificial layer 215. Incidentally, in a case where the third fixed electrodes 212 and the not-shown wires are formed by using aluminum that is generally used in the LSI technology, it is preferable that the aluminum used therein is covered by a silicon nitride film or the aluminum layer is formed in the middle of the insulating layer 210 consisting of plural laminations so as to enhance resistance property against etching of the sacrificial layer 215. As described, the insulating layer 210, each third fixed electrode 212 and each wire (not shown) may be made up by laminating plural layers. Also, each third fixed electrode 212 and each wire may be made up by laminating plural layers exhibiting conductivity.

Figure 14B:
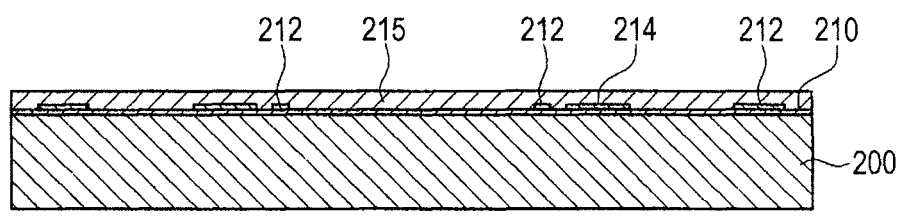
Figure 14C:
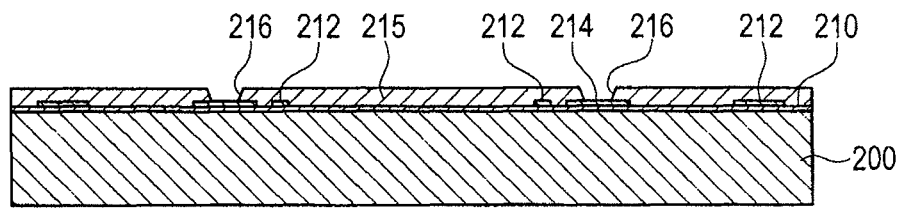

Next, as shown in FIG. 14b, a sacrificial layer 215 is formed so as to thoroughly cover both the insulating layer 210 and the third fixed electrodes 212. The sacrificial layer 215 is formed by making a silicon dioxide film according to CVD (chemical vapor deposition) method, for instance. Thickness of the sacrificial layer 215 is set to 2 µm, for instance. Next, as shown in FIG. 14C, contact holes 216 are formed so that a part of each pad 214 is exposed to the air through the sacrificial layer 215. The contact holes 216 are formed by using photolithography technology, for instance.

Figure 15A:
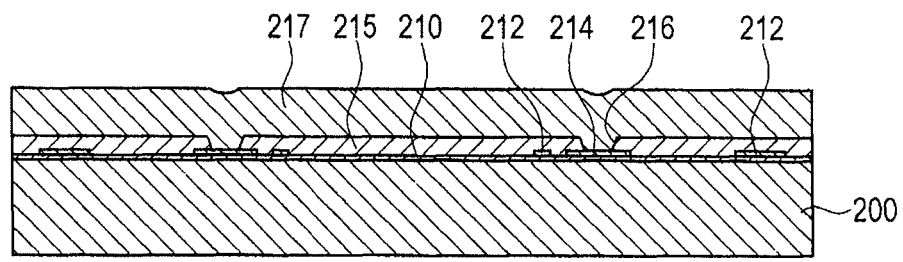
FIG. 15A, FIG. 15B and FIG. 15C are cross-sectional views for illustrating manufacturing process of the acceleration sensor.
Figure 15B:
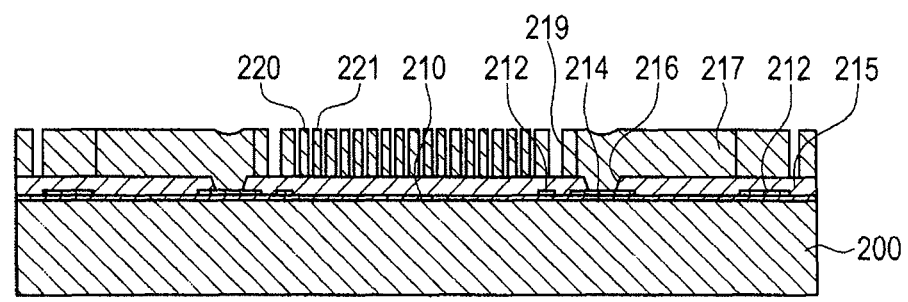

Next, as shown in FIG. 15A, an electrode layer 217 is formed on the sacrificial layer 215. When the electrode layer 217 is formed, the contact holes 216 are filled with the electrode layer 217. The electrode layer 217 is formed by making a polysilicon film according to CVD method, for instance. Thickness of the electrode layer 217 is set to 5-10 µm, for instance. Next, as shown in FIG. 15b, etching process is applied to the electrode layer 217 so as to form a through hole 219, a first fixed electrode 220 and a second fixed electrode 221. The etching process to the electrode layer 217 is performed in such a manner that a resist (not shown) arbitrarily patterned by using photolithography technology is formed on the electrode layer 217, and anisotropic etching process is subsequently applied to a region exposed to the air from an opening portion of the resist by using Deep-RIE (reactive iron etching). Although not shown, a spring 43 is formed by taking manufacturing steps similar to the steps taken for manufacturing the first fixed electrode 220 and the second fixed electrode 221, for instance.

Figure 15C:
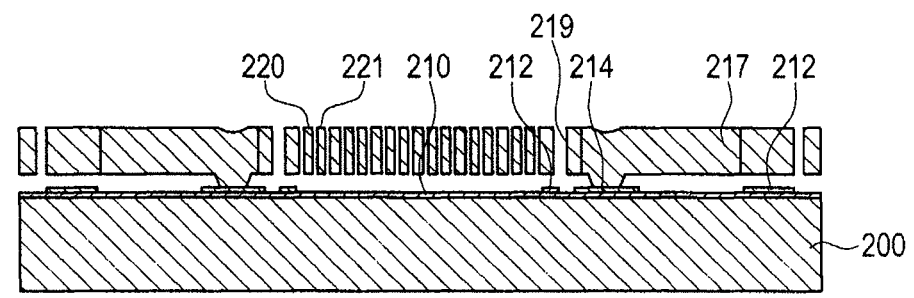

Next, as shown in FIG. 15C, etching process is applied to the sacrificial layer 215. The etching process to the sacrificial layer 215 is performed by pouring etchant (e.g., buffered hydrofluoric acid, (BHF)) from the through holes 219 formed in the electrode layer 217, for instance. Thus, the first sensor 21 shown in FIG. 1 is formed.

According to the present embodiment, the following effects are brought.

(1) Regarding the first sensor 21 and the second sensor 31 constituting the acceleration sensor 10, the first and second fixed electrodes 28, 29 and the electrode components 30 (movable electrode 30B) constituting the electrostatic capacitor 27 are arranged in a row at the center of the weight 24 in an intensive manner. In the above configuration, since there are intensively arranged in a row the constituent elements of the electrostatic capacitor 27 responsible for one detection direction, arrangement manner can be optimized with respect to the first and second connectors 28B, 29B for connecting the first and second fixed electrodes 28, 29 to the substrate 12 and the number of the first and second connectors 28B, 29B can be reduced for miniaturization of the acceleration sensor as a whole. Further, in the above configuration, the area saved by reducing the number of the first and second connectors 28B, 29B can be used for a part to be added to the region for the weight 24, in other words, the increased region for the weight 24 can make the weight 24 heavier and improve sensitivity of the acceleration sensor 21 in comparison with other acceleration sensors with the same electrostatic capacity.

(2) Regarding the first sensor 21 of the present embodiment, each of the movable electrodes 30B is connected to the weight 24 at the long side both ends, namely, at the fixed portions 81 and 82. Owing to the above configuration of the movable electrodes 306 of which both ends are fixed to the weight 24, collision between the movable electrode 30B and the first fixed electrode 28/the second fixed electrode 29 can be avoided even if large acceleration is applied thereto due to impact, etc. Incidentally, the second sensor 31 is structurally identical with the first sensor 21 and brings effect the same as the effect brought by the first sensor 21.

Further, since both ends of each movable electrode 30B are fixed to the weight 24, the movable electrode 30B is hard to get distorted. Therefore, even if the electrostatic capacitor 27 adopts movable electrodes 30B of which length L (refer to FIG. 6) is made longer for desired electrostatic capacity, a sensitivity-improved acceleration sensor can be realized while short-circuit between the movable electrodes 30B and the first fixed electrodes 28/the second fixed electrodes 29 is avoided.

(3) Concerning the first sensor 21 installed in the acceleration sensor 10, each of the pair of springs 43 used in the first sensor 21 is configured to move elastically according to acceleration working in the y-axis direction and acceleration working in z-axis direction while being prevented from elastically moving in the x-axis direction according to acceleration in the x-axis direction. Thereby, acceleration in the y-axis direction and acceleration in the z-axis direction are detected according to a change of electrostatic capacity between the weight 24 made movable according to acceleration and the first through third fixed electrodes 28, 29, 55. That is, each of the pair of springs 43 used in the first sensor 21 is stiff in the x-axis direction so that the first sensor 21 works as a biaxial acceleration sensor. The second sensor 31 installed in the acceleration sensor 10 is structurally identical with the first sensor 21 wherein the difference lies in that the second sensor 31 is configured to detect acceleration in the x-axis direction and acceleration in the z-axis direction. Thereby, thus combined installation of the first sensor 21 and the second sensor 31 constitutes a three-dimensional acceleration sensor. In the thus configured three-dimensional acceleration sensor, each of the pair of springs 43 used in the respective sensors 21 and 31 for holding their respective weights 24 is stiff in one direction. Therefore, each of the pair of springs 43 being stiff in one direction prevents a weight 24 from rotating even though the weight 24 has deviation of center of gravity due to deficiency in manufacturing process. Thereby, there can be obtained the acceleration sensor 10 with improved detection accuracy of acceleration.

(4) The acceleration sensor 10 is configured to detect acceleration working in the z-axis direction by summing up outputs from the first sensor 21 and the second sensor 31 with respect to acceleration in the z-axis direction. Since all of the sensors (first sensor 21 and second sensor 31) installed in the acceleration sensor 10 involve in detection of acceleration in the z-axis direction, the acceleration sensor 10 can achieve excellence in miniaturizing its dimension in comparison with a different-type three-dimensional acceleration sensor consisting of three uniaxial acceleration sensors.

(5) When the first sensor 21 is seen from the top, each of the pair of springs 43 used therein is positioned such that its movable end 43B is closer to the outside than its fixed end 43A. Owing to the thus positioned each of the pair of springs 43, influence of rotation moment working on the weight 24 is reduced and detection accuracy of the first sensor 21 can be improved. Further, the collision between the electrode component 30 and the first fixed electrode 28/the second fixed electrode 29 can be avoided.

(6) Regarding each of the first sensor 21 and the second sensor 31, the first stoppers 23A and the second stoppers 23B each for restricting movement of the weight 24 are arranged at the regions R1, R3, R7 and R9 all of which are positioned so as not to face the first and second fixed electrodes 28, 29 with reference to the x-axis direction and y-axis direction. In the above configuration, positions where the first stoppers 23A and the second stoppers 23B get engaged with the weight 24 are set exterior to positions of the first and second fixed electrodes 28, 29. In a case where acceleration working in the x-axis and y-axis directions causes the weight 24 to rotate, for instance, movement amount the weight 24 makes with reference to each of the x-axis and y-axis directions becomes larger in proportion to increase of distance from rotation center. Therefore, by adopting such an arrangement manner that positions where the respective stoppers 23A, 23B get engaged with the weight 24 are set exterior to positions of the respective fixed electrodes 28, 29, the weight 24 gets engaged with the respective stoppers 23A, 23B whereat movement amount of the weight 24 is large. Thereby, the engagement with the stoppers 23A, 23 restricts movement of the weight 24 so that collision between the electrode component 30 and the first fixed electrode 28/the second fixed electrode 29 can be avoided reliably.

(7) Further, since the spring 43 used in each of the first sensor 21 and the second sensor 31 is stiff in the direction which is perpendicular to acceleration detection direction, the spring 43 can prevent the weight 24 from moving in a non-acceleration-detection direction when large impact, etc., is applied to the sensor. Thereby, collision between the electrode component 30 and the first fixed electrode 28/the second fixed electrode 29 can be avoided more reliably.

Although the embodiments of the present invention have been described in detail, it should be understood that the various changes, substitutions, and alterations could be made hereto without departing from the spirit and scope of the invention.

For instance, in the above embodiment, each of the first sensor 21 and the second sensor 31 is served as a biaxial acceleration sensor capable of detecting acceleration with reference to two axial directions. Each of them, however, may be served as a uniaxial acceleration sensor capable of detecting acceleration with reference to only single axial direction. For instance, regarding the spring 43 for the first sensor 21, the "type 1" spring 100A shown in FIG. 12 may be employed so as to serve as a uniaxial acceleration sensor for detecting acceleration in the y-axis direction. In the thus configured uniaxial acceleration sensor, constituent elements of the electrostatic capacitor 27 may be arranged at the center of the weight 24 in an intensive manner or both ends of each movable electrode 30B may be fixed to the weight 24.

In the above described embodiment, the first stoppers 23A and the second stoppers 23B are arranged at the regions R1, R3, R7 and R9 all of which are positioned so as not to face the first and second fixed electrodes 28, 29 with reference to the x-axis direction and y-axis direction. In this connection, the above configuration may be modified properly as long is as the modified configuration can somehow get the weight 24 engaged at the regions R1, R3, R7 and R9 for restricting movement of the weight 24. That is, even no arrangement of the stoppers 23A, 23B at the regions R1, R3, R7 and R9, the configuration to get the weight 24 engaged at the above regions can bring the similar effect brought by the stoppers 23A, 23B arranged at the above regions.

Further, in the above described embodiment, there may be adopted the configuration to omit either the first stoppers 23A or the second stoppers 23B. For instance, the first sensor 21 may be furnished with only the first stoppers 23A (four first stoppers 23A) each facing the weight 24 with reference to the detection direction.

Figure 16:
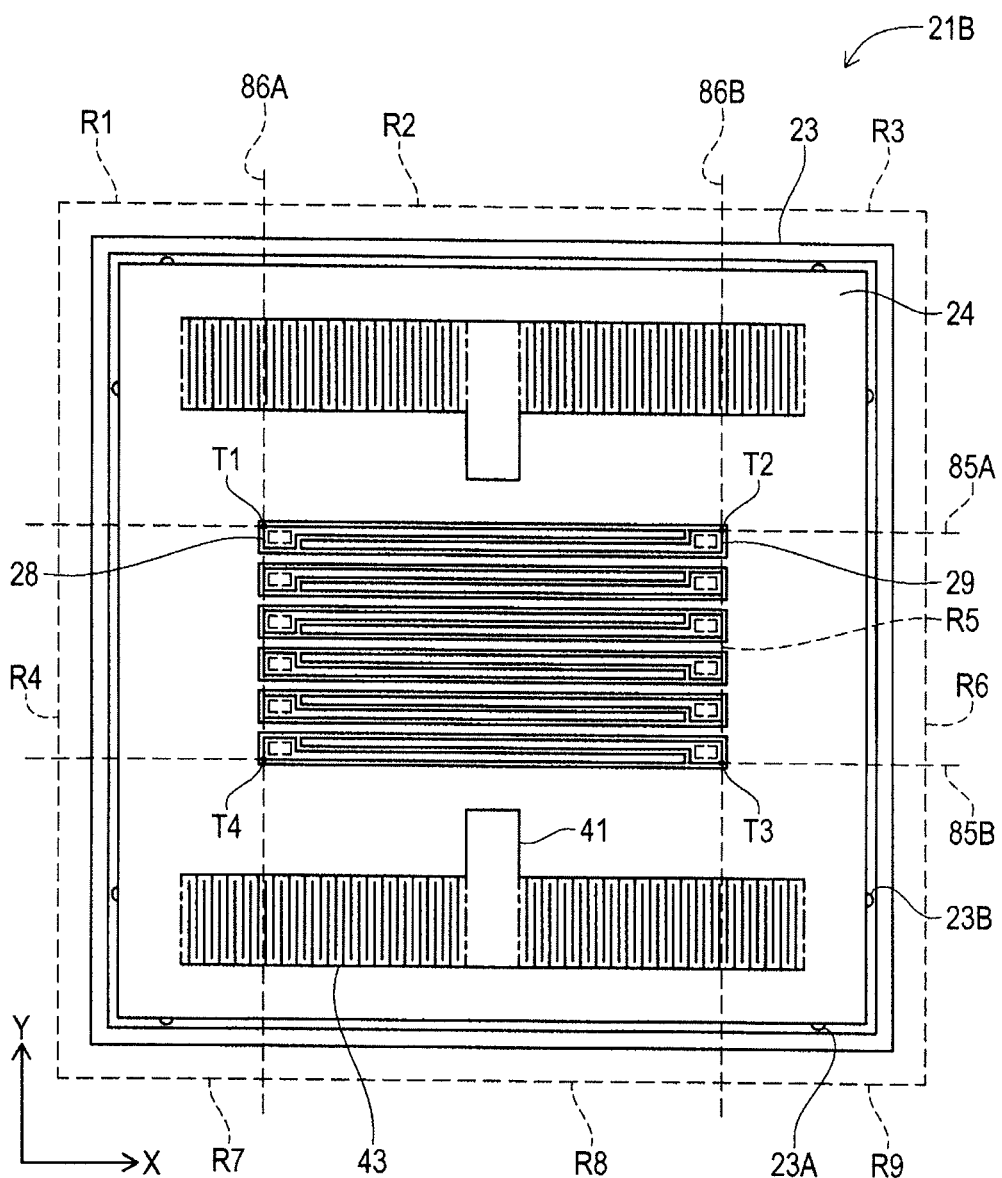
FIG. 16 is a view for illustrating stoppers used in other sensor.

In the above described embodiment, the shape and etc. of the first stoppers 23A and those of the second stoppers 23B are merely examples and shape and etc. of those stoppers may be modified properly. For instance, like the first sensor 216 shown in FIG. 16, there may be adopted the configuration to arrange first stoppers 23A and the second stoppers 23B at outer periphery of the weight 24. In this case, the first sensor 21B is configured such that the first stoppers 23A and the second stoppers 23B are arranged on the outer periphery of the weight 24 so as to project outward and get engaged with an external frame 23. The configuration described herein can bring the similar effect brought by the stoppers 23A, 23B described in the embodiment.

Further, regarding the first sensor 21B, the first stoppers 23A and the second stopper 23B are positioned so as be symmetric to each other with reference to the center of gravity of the weight 24. In this configuration, by symmetrically arranging the first stoppers 23A and the second stoppers 23B with reference to the weight 24 that especially requires symmetry for keeping detection accuracy of acceleration, collision between the electrode component 30 and the first fixed electrode 28/the second fixed electrode 29 can be avoided while detection accuracy is favorably kept.

Figure 17:
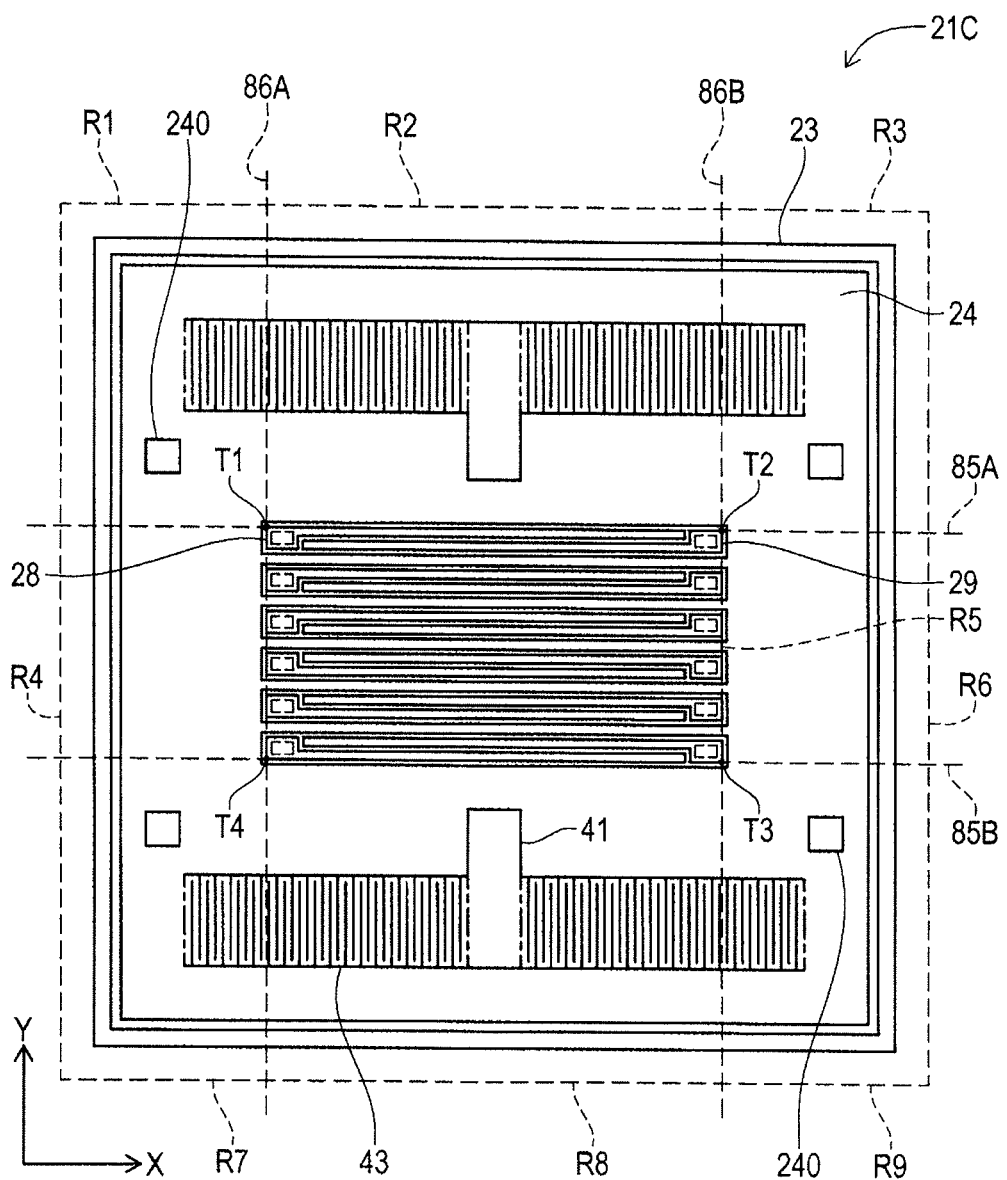
FIG. 17 is a view for illustrating stoppers used in other sensor.

Further, like the first sensor 21C shown in FIG. 17, there may be adopted configuration such that stoppers are arranged penetrating through the weight 24 in the z-axis direction so that the stoppers can get engaged with inner parts of the weight 24, for instance. Regarding the first sensor 21C, the stoppers 240 are arranged upright on the substrate 12 (refer to FIG. 1) at the regions R1, R3, R7 and R9, in a shape of a pillar penetrating through the weight 24 in the z-axis direction. The stoppers 240 restrict movement of the weight 24 by getting engaged with through holes formed in the weight 24. Thereby, collision between the electrode component 30 and the first fixed electrode 28/the second fixed electrode 29 can be avoided. The configuration described herein can bring the similar effect brought by the stoppers 23A, 23B described in the embodiment. Incidentally, a convex portion may be arranged on each of the stoppers 240 at its surface facing the weight 24 so that contact area of the stopper 240 and the weight 24 is reduced for avoidance of stiction.

Further, in the above described embodiment, each of the first sensor 21 and the second sensor 31 is adopted as a sensor capable of detecting acceleration working in one axial direction with reference to the plane direction of the weight 24. Each of those sensors, however, may be a sensor capable of detecting acceleration working in two axial directions. For instance, the first sensor 21D shown in FIG. 18 includes an electrostatic capacitor 232 responsible for x-axis directional acceleration, in addition to the electrostatic capacitor 231 responsible for y-axis directional acceleration. In this case, regarding the springs 43 for the first sensor 21D, there may be employed "type 2" springs 100B shown in FIG. 12C, that are elastic and movable in x-axis, y-axis and z-axis directions.

Figure 18:
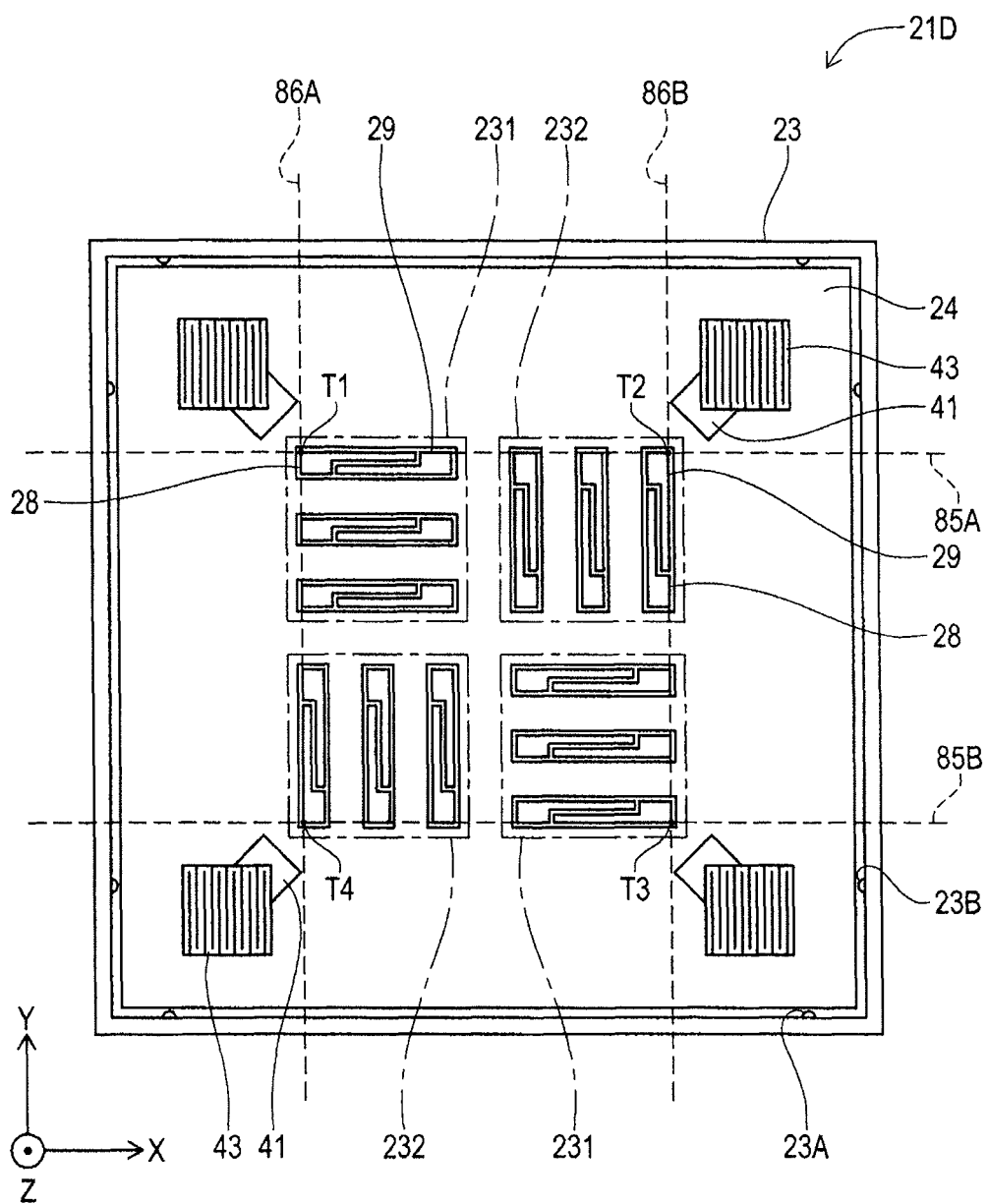
FIG. 18 is a view for illustrating other sensor.

For instance, regarding the first sensor 21D shown in FIG. 18, there may be set end points T1 through T4 so as to correspond to apexes of a rectangular shape (square in FIG. 18) enclosing the entirety of the first fixed electrodes 28 and the second fixed electrodes 29 provided for the is respective electrostatic capacitors 231, 232 when seen from the top. With reference to the end points T1 through T4, there are defined the first lines 85A, 85B, the second lines 86A, 86B and regions R1 through R9 (refer to FIG. 7). With reference to the thus defined regions R1 through R9, positions of the first stoppers 23A and the second stopper 23B may be determined. In the above configuration, the first stoppers 23A and the second stoppers 23B are arranged for movement restriction in the y-axis direction and the x-axis direction, respectively. Therefore, the thus arranged first and second stoppers 23A, 23B can restrict movement of the weight 24 that moves in both x-axis and y-axis directions and collision among electrodes of the respective electrostatic electrodes 231, 232 can be avoided reliably.

Figure 19:
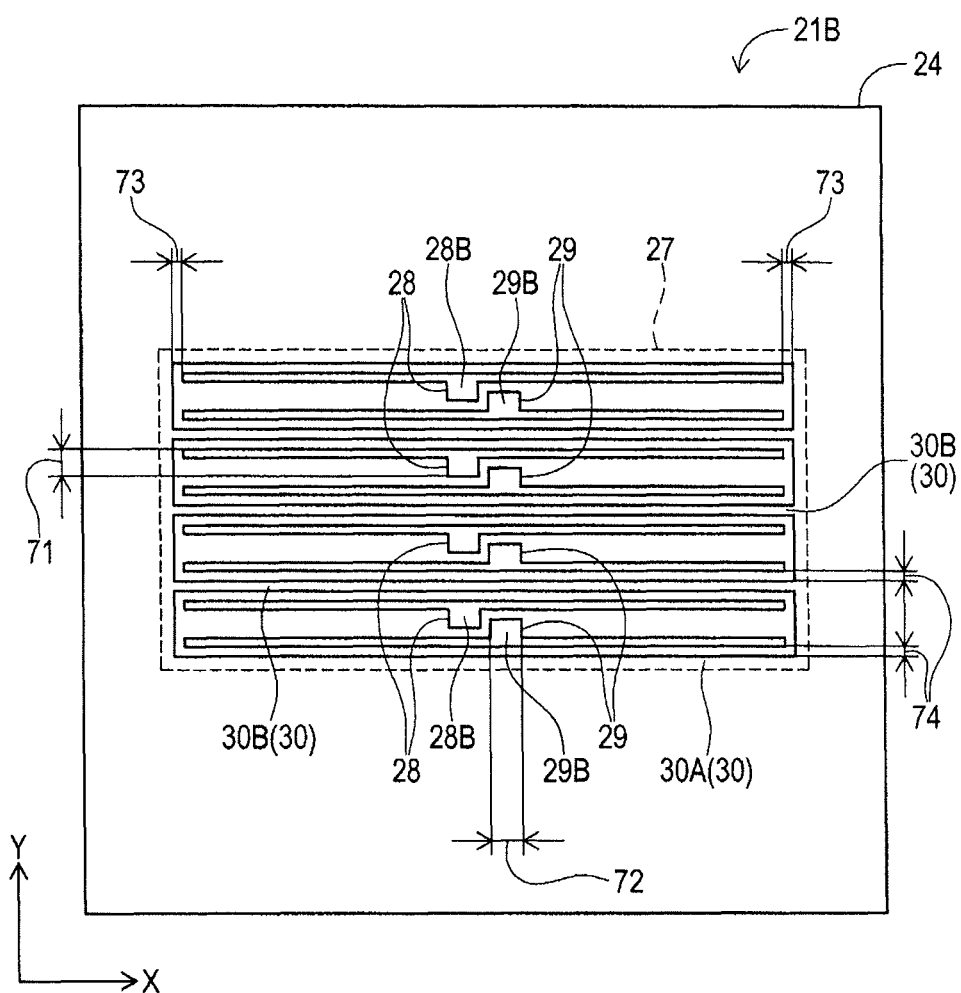
FIG. 19 is a view for illustrating arrangement electrostatic capacitors employed by other acceleration sensor.

In the above described embodiment, the first connector 28B and the second connector 29B are provided at long side directional one end of the first fixed electrode 28 and that of the second fixed electrode 29, respectively. The arrangement manner of connectors, however, is not restricted to the above. For instance, like the first sensor 21B shown in FIG. 19, the first connectors 28B and the second connectors 296 may be arranged at substantial center of the first fixed electrodes 28 and the second fixed electrode 29, respectively, with reference to their long side direction (x-axis direction). Adoption of this configuration can be shortened x-axis directional length of the sensor by length of width 73 and miniaturization of the sensor can be realized.

In the above described embodiment, constituent elements of the electrostatic capacitor 27 are intensively arranged so that center of the electrostatic capacitor 27 coincides with the center of gravity 70 of the weight 24. However, those constituent elements may be intensively arranged so that the electrostatic capacity 27 is positioned at substantial center of the weight 24.

Figure 20:
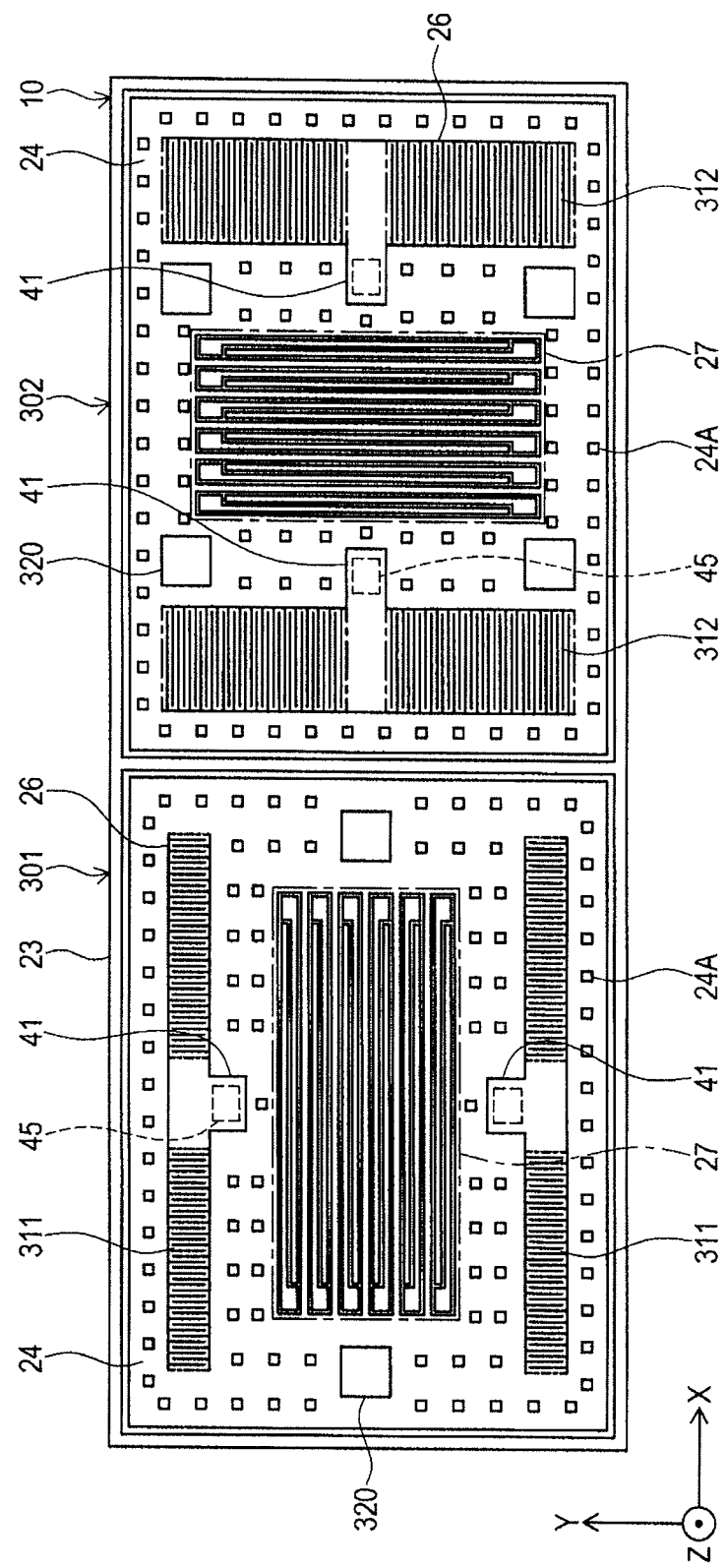
FIG. 20 is a plane view for illustrating the other acceleration sensor.

The first sensor 21 is a substantially square shape when seen from the top, but the shape of the first sensor 21 is not restricted to that shape. For instance, each of a first sensor 301 and a second sensor 302 shown in FIG. 20 is a substantially rectangular shape when seen from the top. Each of the first sensor 301 and the second sensor 302 is formed into a substantially rectangular shape of which long side extends in the x-axis direction when seen from the top. Each spring 311 used in the first sensor 301 is configured such that its x-axis directional length is made longer and its y-axis directional length is made shorter in comparison with the x-axis directional length and y-axis directional length of each spring 43 used in the first sensor 21. Each spring 312 used in the second sensor 302 is configured such that its x-axis directional length is made longer and its y-axis directional length is made shorter in comparison with the x-axis directional length and y-axis directional length of each spring 43 used in the second sensor 31. Despite proportional difference in the x-axis and y-axis directions, both springs 311 and 312 are also stiff in one direction. Therefore, each of the first sensor 301 and the second sensor 302 can be used as a biaxial acceleration sensor. That is, the thus configured first sensor 21 and second sensor 31 can reduce structural restriction and improve degree of flexibility in designing shape.

Further, each of the first sensor 301 and the second sensor 302 shown in FIG. 20 includes stoppers 320 for preventing stiction between the weight 24 and other parts thereof. Each stopper 320 is arranged upright on the substrate 12 (refer to FIG. 1) like a pillar penetrating the weight 24 in the z-axis direction. Each stopper 320 gets engaged with the weight 24 so as to prevent the weight 24 from sticking to other parts such as the first fixed electrodes 28, for instance. Further, although it is not shown, a convex portion is arranged on the stopper 320 at its surface facing the weight 24, whereby contact area of the stopper 320 and the weight 24 is reduced for effective avoidance of stiction therebetween. Further, the above such convex portion may be arranged on other portion such as the anchor 45 at its surface facing the weight 24 so as to work as stopper 320. Further, the configuration to avoid stiction is not restricted to the stopper 320. Hydrophobic material may be applied to an edge surface of arbitrary part for avoiding stiction.

Further, shapes of respective elements, configuration, etc. are merely exemplarily shown and may be modified appropriately. For instance, the first sensor 21 and the second sensor 31 may be made different in configuration within the gist of the present application.

Incidentally, the acceleration sensor 10, the first sensors 21, 21A through 21E and the second sensor 31 are examples of acceleration sensors. The frame 23, the first stopper 23A and the second stopper 23B are examples of restrictors. The weight 24 is an example of a weight. The electrostatic capacitor 27 is an example of an electrostatic capacitor. The first fixed electrode 28 and the second fixed electrode 29 are examples of fixed electrodes. The first connector 28 is an example of a first connector. The second connector 29 is an example of a second connector. The electrode component 30, the external electrode 30A and the movable electrode 30B are examples of movable electrodes. The regions R1 through R9 are examples of regions. The end points T1 through T4 are examples of apexes of a rectangular frame.

Next, there will be described technical ideas and effect of the technical ideas that can be led from the above mentioned embodiments.

In the acceleration sensor disclosed in the present application, center of the electrostatic capacitor may be arranged at the center of the region surrounded by the periphery of the weight in the plane view of the substrate. The above acceleration sensor is configured such that the to center of the electrostatic capacitor coincides with the center of the weight.

Thereby, an area to be occupied by an electrostatic capacitor can be made smaller, which can contribute to miniaturization of the acceleration sensor as a whole.

In the acceleration sensor disclosed in the present application, is the center of the region surrounded by the periphery of the weight may be center of gravity of the weight. The above acceleration sensor is configured such that center of gravity of the weight coincides with the center of the weight on which the electrostatic capacitor is arranged. Thereby, the weight can be configured symmetric with reference to the center of gravity of the weight. By reducing deviation of center of gravity with reference to the weight to be arranged movably, irregular movement such as rotational movement of the weight is avoided and sensitivity of the acceleration sensor can be improved.

In the acceleration sensor disclosed in the present application, a set of the fixed electrodes may include: a first fixed electrode and a second fixed electrode arranged so as to adjoin each other within a region between neighboring two of the movable electrodes; a first connector that connects the first fixed electrode and the substrate; and a second connector that connects the second fixed electrode and the substrate. Further, the first connector may be configured to be wide toward the second fixed electrode adjoining the first fixed electrode so that the first fixed electrode faces the movable electrode in a state of a straight line. Further, the second connector may be configured to be wide toward the first fixed electrode adjoining the second fixed electrode so that the second fixed electrode faces the movable electrode in a state of a straight line.

It is generally assumed that arrangement of the first connector and the second connector increase total width of respective electrodes. In the above acceleration sensor, the first connector and the second connector are configured to stretch wide toward their respective adjoining electrode so that the first fixed electrode/the second fixed electrode are set to face the movable electrode in a state of a straight line. Accordingly, in above the acceleration sensor equipped with first and second fixed electrodes, arrangement of their respective connectors can be optimized, which can contribute to miniaturization of the acceleration sensor as a whole.

In the acceleration sensor disclosed in the present application, each of the fixed electrodes may be fixed to the substrate and formed in a plate of which surface is perpendicular to both the flat surface direction of the substrate and the detection direction. Further, each of the movable electrodes may be configured to extend from the weight and formed in a plate of which surface faces each of the fixed electrodes in parallel. By optimizing arrangement of the fixed electrodes and the movable electrodes each of which are formed in a flat plate shape, more efficient miniaturization of the acceleration sensor as whole and improvement of sensitivity can be achieved.

In the acceleration sensor disclosed in the present application, each of the fixed electrodes may include a set of a first fixed electrode and a second fixed electrode arranged so as to adjoin each other within a region between neighboring two of the movable electrodes. Further, when the weight moves, a capacity change subject to the first fixed electrode and the movable electrode adjoining the first fixed electrode and a capacity change subject to the second fixed electrode and the movable electrode adjoining the second fixed electrode may be made in an inverse direction for each other. In the above acceleration sensor equipped with each of the first fixed electrodes and each of the second fixed electrodes configured to made change their capacity in an inverse direction for each other when the weight moves, short-circuit between each of the fixed electrodes and each of the movable electrodes can be avoided.

In the acceleration sensor disclosed in the present application, each of the movable electrodes may be configured to extend from the weight and equipped with at least two fixed portions to be connected to the weight.

In the above acceleration sensor, each of the movable electrodes is connected to the weight through two or more of fixed portions. Thereby, since each of the movable electrodes is fixed at two or more of fixed portions, this configuration can avoid distortion or expansion at middle part of each of the movable electrodes even if large acceleration is applied to the sensor due to impact, etc. Thereby, this configuration can avoid each of the movable electrodes from contacting or colliding against each of the fixed electrodes as well as short-circuit between electrodes.

In the acceleration sensor disclosed in the present application, the fixed portions may be provided at both ends of each of the movable electrodes. Thereby, the above configuration can reliably avoid each of the movable electrodes from distortion caused by acceleration.

In the acceleration sensor disclosed in the present application, each of the movable electrodes may be formed in a plate of which surface is perpendicular to both the flat surface direction of the substrate and the detection direction. Further, the fixed portions may be provided at both ends of the plate of each of the movable electrodes. Since both ends of each of the flat-plate-shaped movable electrodes are fixed to the weight by the fixed portions, the above configuration can reliably avoid each of the movable electrodes from distortion caused by acceleration.

In the acceleration sensor disclosed in the present application, the acceleration sensor may further include restrictors that restrict movement of the weight in the detection direction when the acceleration works and causes the weight to move in the detection direction. Further, when there is defined a rectangular frame surrounding the fixed electrodes as a whole in the plane view of the substrate and consisting of four sides two of which being parallel with the detection direction and other two of which being perpendicular to the detection direction, with reference to four apexes of the rectangular frame, the substrate may be divided into nine regions by two first lines each passing through two of apexes positioned in a direction perpendicular to the detection direction and two second lines each passing through two of apexes positioned in the detection direction. Further, the restrictors may restrict movement of the weight at each of four regions occupying four corners of the substrate divided into nine regions, the four regions being regions other than a region containing the fixed electrodes and regions adjoining the region containing the fixed electrodes.

In the above acceleration sensor, the restrictors for restricting the weight's movement in the detection direction get engaged with the weight at regions that do not face the fixed electrodes in the detection direction and the direction perpendicular to the detection direction, so as to restrict movement of the weight. More specifically, there is defined a rectangular frame surrounding the entirety of the fixed electrodes in the plane view and with reference to four apexes of the rectangular frame, the substrate is divided into nine regions by two of first lines each passing through two of apexes positioned in the direction perpendicular to the detection direction and two of second lines each passing through two of apexes positioned in the detection direction. The restrictors restrict movement of the weight at each of four regions other than a region containing the fixed electrodes and regions adjoining the region containing the fixed electrodes.

In the above acceleration sensor, positions where the restrictors get engaged with the weight are set exterior to positions where the fixed electrodes are arranged with reference to both the detection direction and the direction perpendicular to the detection direction. For instance, in a case where acceleration working in the detection direction and the direction perpendicular to the detection direction causes the weight to rotate, movement amount the weight makes with reference to the detection direction becomes larger in proportion to increase of distance from rotation center. Therefore, in a case where rotation axis of the weight coincides with the center of the fixed electrode, the restrictors are configured to get engaged with the weight at positions away from the center of the fixed electrodes further than ends of the fixed electrodes, the weight gets engaged with the restrictors whereat movement amount of the weight is large. Thereby, the engagement with the restrictors restricts movement of the weight so that collision between the electrode component and the fixed electrode can be avoided reliably. That is, proper arrangement of the restrictors can reliably avoid collision between the electrode component and the fixed electrode.

In the acceleration sensor disclosed in the present application, each of the fixed electrodes may be formed in a plate of which surface is perpendicular to both the flat surface direction of the substrate and the detection direction, and the fixed electrodes may be arranged in the detection direction. Further, the rectangular frame may be set so as to surround periphery of the fixed electrodes as a whole.

In the above acceleration sensor, the fixed electrodes each formed in a flat plate shape are arranged in parallel to one another and periphery of the fixed electrodes as a whole looks like a rectangular frame when seen from the top. The rectangular frame is defined as periphery of the fixed electrodes as a whole, so that the region containing the fixed electrodes and regions adjoining the region containing the fixed electrodes can be made smaller for optimization. That is, regions for arrangement of the restrictors can be secured as large as possible.

In the acceleration sensor disclosed in the present application, the restrictors may be fixed to the substrate at the four regions so that the restrictors are symmetrically positioned with reference to center of gravity of the weight.

In the above acceleration sensor, the restrictors are fixed to the substrate at positions symmetric to the weight, thereby collision between the electrode component and the fixed electrode can be avoided reliably.

The technology disclosed in the present application provides is an acceleration sensor capable of achieving improvement of sensitivity and comprehensive miniaturization of the acceleration sensor.

Further, the technology disclosed in the present application provides an electrostatic-capacitor-type acceleration sensor capable of avoiding short-circuit of a fixed electrode and a movable electrode.

Further, the technology disclosed in the present application provides an electrostatic-capacitor-type acceleration sensor capable of reliably avoiding collision between a movable electrode and a fixed electrode by proper arrangement of restrictors for restricting movement of a weight.

It will be apparent for those skilled in the art various alternations, substitutions, improvements, combinations and the like can be made.

What is claimed is:

1. An acceleration sensor comprising:
   a substrate;
   an inertial mass that is spaced from the substrate and moveable along a detection direction which lies in an x-y plane, the inertial mass having a periphery and a center of gravity as viewed along the x-y plane; and
   an electrostatic capacitor array located within the periphery of the inertial mass and surrounding the center of gravity of the inertial mass as viewed along the x-y plane, the electrostatic capacitor array including a plurality of capacitor elements each having a respective fixed electrode and a respective movable electrode, the movable electrodes moving along the detection direction in response to an acceleration of the inertial mass in the detection direction, the distance between each of the fixed electrodes on the one hand and its associated movable electrode on the other varying, and therefore the electrostatic capacity of the capacitor elements varying, according to the acceleration of the inertial mass in the detection direction.

2. The acceleration sensor according to claim 1, wherein the electrostatic capacitor array is located in the center of the inertial mass as viewed along the x-y plane.

3. The acceleration sensor according to claim 1, wherein:
   the fixed electrodes include first and second fixed electrodes each having a first and second opposed principal surfaces, the first principal surface of the first fixed electrode facing and being parallel to the first principal surface of the second fixed electrode;
   the movable electrodes include first and second moveable electrodes each having a first principal surface, the first principal surface of the first moveable electrode facing and being parallel to the second principle surface of the first fixed electrode, the first principal surface of the second moveable electrode facing and being parallel to the second principle surface of the second fixed electrode.

4. The acceleration sensor according to claim 3, wherein the first and second fixed electrodes have an L shape as viewed along the x-y plane.

5. The acceleration sensor according to claim 4, wherein the first and second fixed electrodes are nestled together with the two L-shapes overlapping one another.

6. The acceleration sensor according to claim 5, wherein each of the first and second fixed electrodes have respective long and short arms together define the L-shape, the long arm of the first fixed electrode facing and lying parallel to the long arm of the second fixed electrode, the short arm of the first fixed electrode lying parallel to the short arm of the second fixed electrode.

7. The acceleration sensor according to claim 3, wherein:
the first moveable electrode and the first fixed electrode define a first of the capacitor elements whose capacitance varies as a function of the spacing between the first principal surface of the first moveable electrode and the second principal surface of the first fixed electrode;
the second moveable electrode and the second fixed electrode define a second of the capacitor elements whose capacitance varies as a function of the spacing between the first principal surface of the second moveable electrode and the second principal surface of the second fixed electrode; and
when the inertial mass moves in the detection direction, the capacity of the first and second capacitor elements vary in an inverse manner.

8. The acceleration sensor according to claim 7, wherein:
each of the fixed electrodes is fixed to the substrate and has the shape of a plate whose principal surface extends in a direction perpendicular to both the x-y plane and the detection direction, and
each of the movable electrodes form part of the inertial mass and has the shape of a plate whose principal surface faces a respective one of the fixed electrodes and is parallel to the principal face of that electrode.

9. The acceleration sensor according to claim 1, further including restrictors which restrict the movement of the inertial mass in the detection direction to prevent the moveable electrodes from physically contacting the fixed electrodes.

10. The acceleration sensor according to claim 9, wherein the restrictors also prevent rotation of the inertial mass around the center of gravity.

11. The acceleration sensor according to claim 9, further comprising a frame surrounding the inertial mass, the restrictors being coupled to the frame.

12. The acceleration sensor according to claim 1, wherein the inertial mass is constrained from moving in any direction other than the detection direction.

13. The acceleration sensor according to claim 12, wherein the inertial mass is connected to a frame by springs which allow the mass to move in the detection direction but constrain movement of the inertial mass in other directions.

14. The acceleration sensor according to claim 1, wherein the capacitor array is symmetrically disposed around the center of gravity of the inertial mass.

15. The acceleration sensor according to claim 1, wherein the inertial mass is rectangular in shape and the detection direction is parallel to two opposed sides of the rectangular shaped inertial mass.

16. The acceleration sensor according to claim 15, wherein the capacitor array has a rectangular shape whose sides lie parallel to the sides of the inertial mass.

17. The acceleration sensor according to claim 1, wherein the center of gravity of the electrostatic capacitor array corresponds to the center of gravity of the inertial mass.

\* \* \* \* \*